US008103470B2

(12) United States Patent
Teshirogi et al.

(10) Patent No.: US 8,103,470 B2
(45) Date of Patent: Jan. 24, 2012

(54) METHOD, COUPLER AND APPARATUS FOR MEASURING RADIATED POWER

(75) Inventors: Tasuku Teshirogi, Tokyo (JP); Aya Hinotani, Atsugi (JP); Takashi Kawamura, Atsugi (JP); Toru Sakuma, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 42 days.

(21) Appl. No.: 12/716,711

(22) Filed: Mar. 3, 2010

(65) Prior Publication Data

US 2010/0153045 A1 Jun. 17, 2010

Related U.S. Application Data

(63) Continuation of application No. PCT/JP2008/067315, filed on Sep. 25, 2008.

(30) Foreign Application Priority Data

Sep. 28, 2007 (JP) ................................. 2007-253643

(51) Int. Cl.
*G01R 29/08* (2006.01)
(52) U.S. Cl. ........................................................ 702/76
(58) Field of Classification Search .................... 702/76, 702/77; 343/703, 853
See application file for complete search history.

(56) References Cited

U.S. PATENT DOCUMENTS

| 4,931,798 A | * | 6/1990 | Kogo | ................................. 342/4 |
| 7,420,522 B1 | * | 9/2008 | Steinbrecher | ................. 343/853 |

FOREIGN PATENT DOCUMENTS

| JP | 63-193899 | 12/1988 |
| JP | 1-280399 | 11/1989 |
| JP | 2000-324063 | 11/2000 |
| JP | 3436669 | 6/2003 |
| JP | 2003-318811 | 11/2003 |
| JP | 2003-332785 | 11/2003 |
| JP | 2006-322921 | 11/2006 |
| JP | 2007-40894 | 2/2007 |
| WO | WO 2009/136638 A1 | 11/2009 |

OTHER PUBLICATIONS

English translation of the IPRP, issued in Int'l. App. No. PCT/JP2008/067315, mailed May 14, 2010.

(Continued)

*Primary Examiner* — Bryan Bui
(74) *Attorney, Agent, or Firm* — Greer, Burns & Crain, Ltd.

(57) ABSTRACT

In a method for measuring a radiation power, an elliptical mirror is prepared so as to have a elliptical spherical space enclosed by a metal wall surface, the space having a rotating axis passing through two focal points. A device under test is placed in a position of one of the two focal points such that a center of radiation of a radio wave substantially coincides with the focal point, and a receiving antenna is placed in an position of an other one of the two focal points. The device under test is caused to radiate a radio wave and the radiated radio wave is reflected at the wall surface to allow the receiving antenna to receive the radio wave. Then, total radiation power of the radio wave is measured at a measurement end of the receiving antenna in accordance with an output signal from the receiving antenna.

13 Claims, 23 Drawing Sheets

OTHER PUBLICATIONS

Tomoyuki Nojima et al.; "Simplified High Accuracy Measuring Method for Radio Equipment Using Integral Antennas: Radiated RF Power Measurement Using a Spherical Positioner (Part 1);" IEIC Technical Report, AP2002-61, pp. 29-34; Jul. 2002.

Tomoyuki Nojima et al.; "Simplified High Accuracy Measuring Method for Radio Equipment Using Integral Antennas: Radiated RF Power Measurement Using a Spherical Positioner (Part 2);" IEIC Technical Report, AP2003-85, pp. 125-130; Jul. 2003.

* cited by examiner

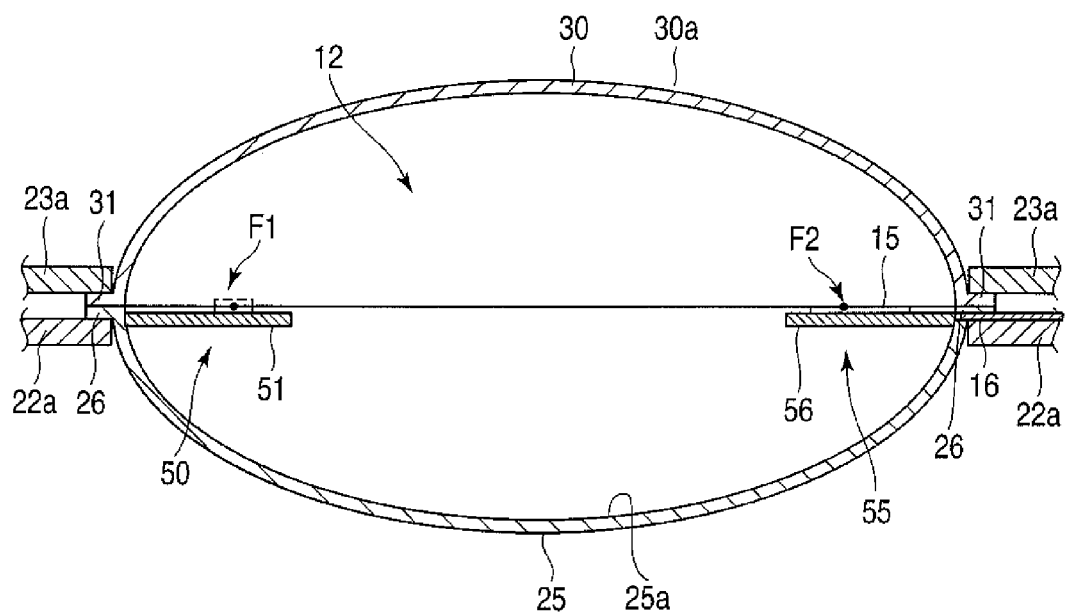
F I G. 5
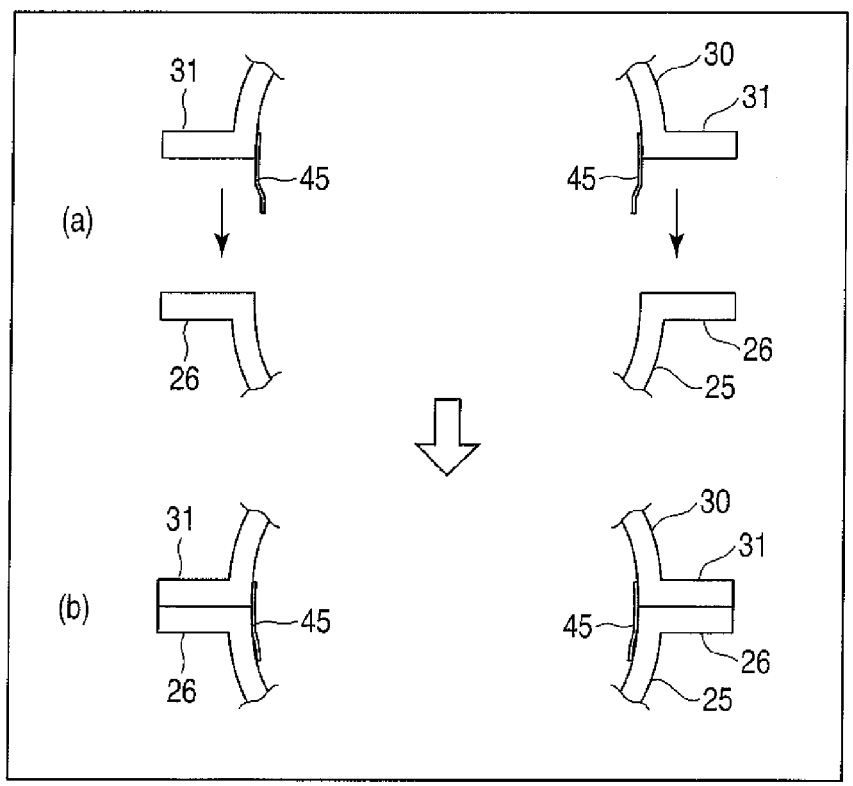
F I G. 6

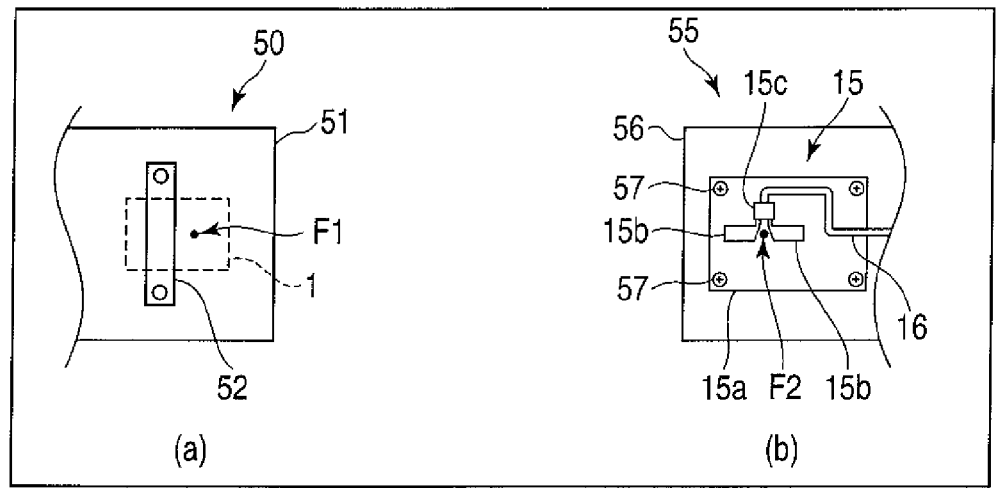
F I G. 7
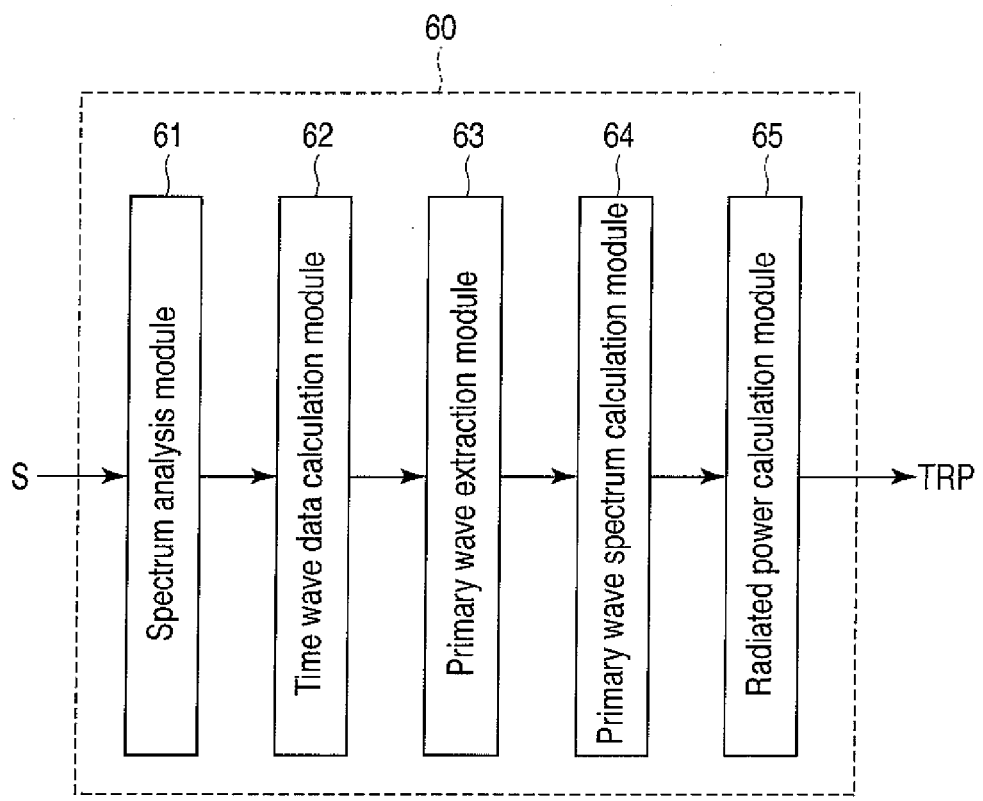
F I G. 8

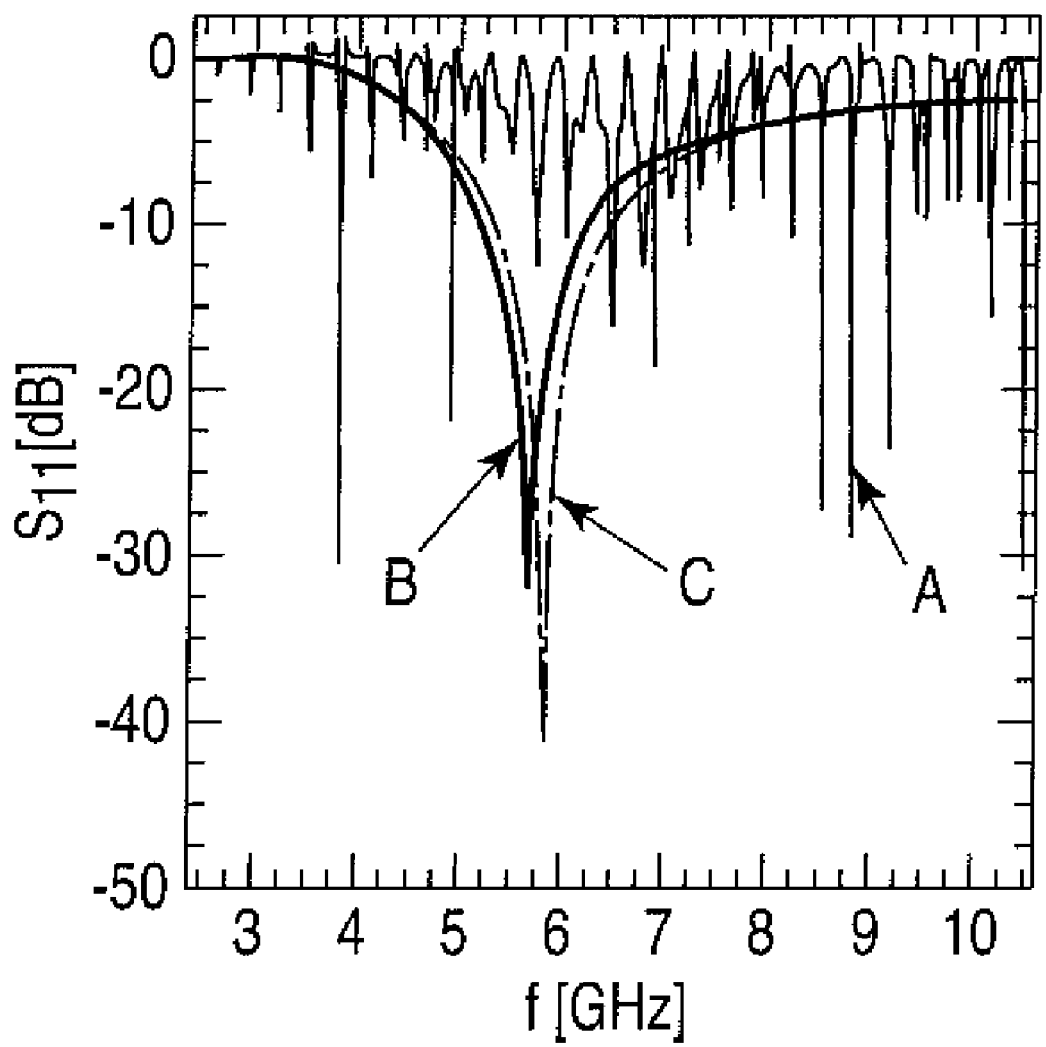
F I G. 12

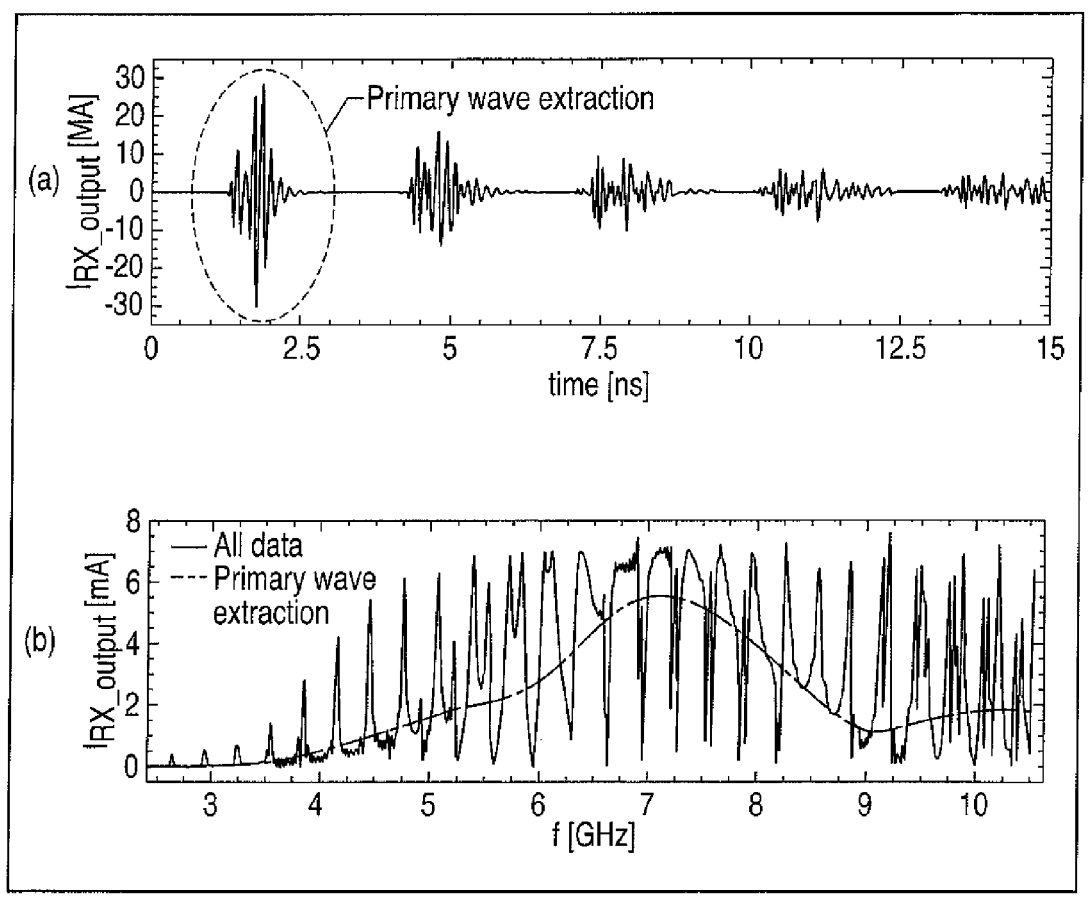
F I G. 13

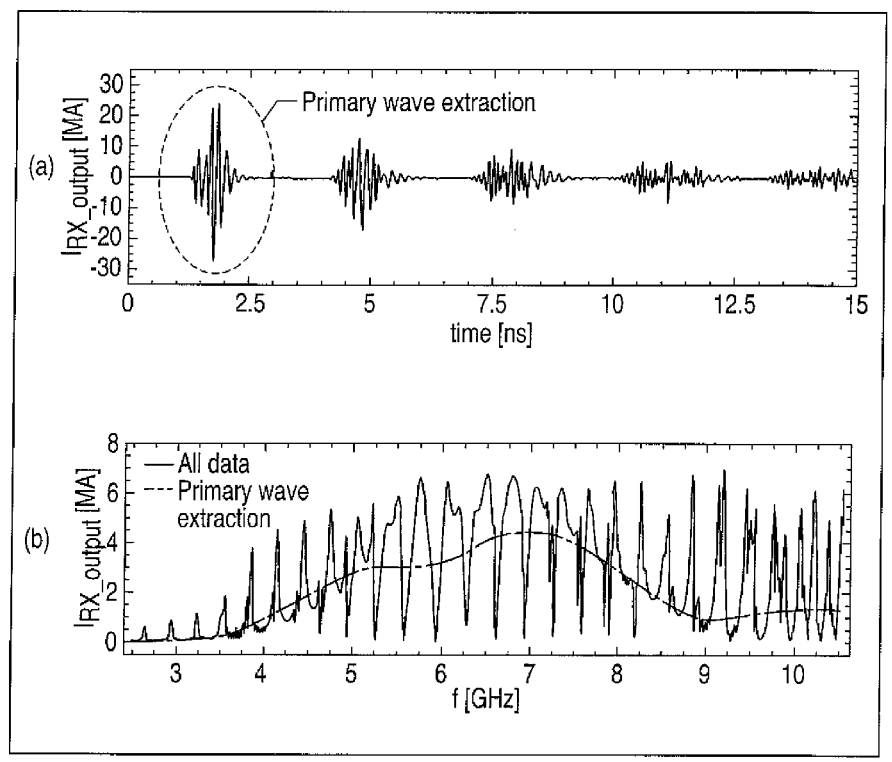
F I G. 14

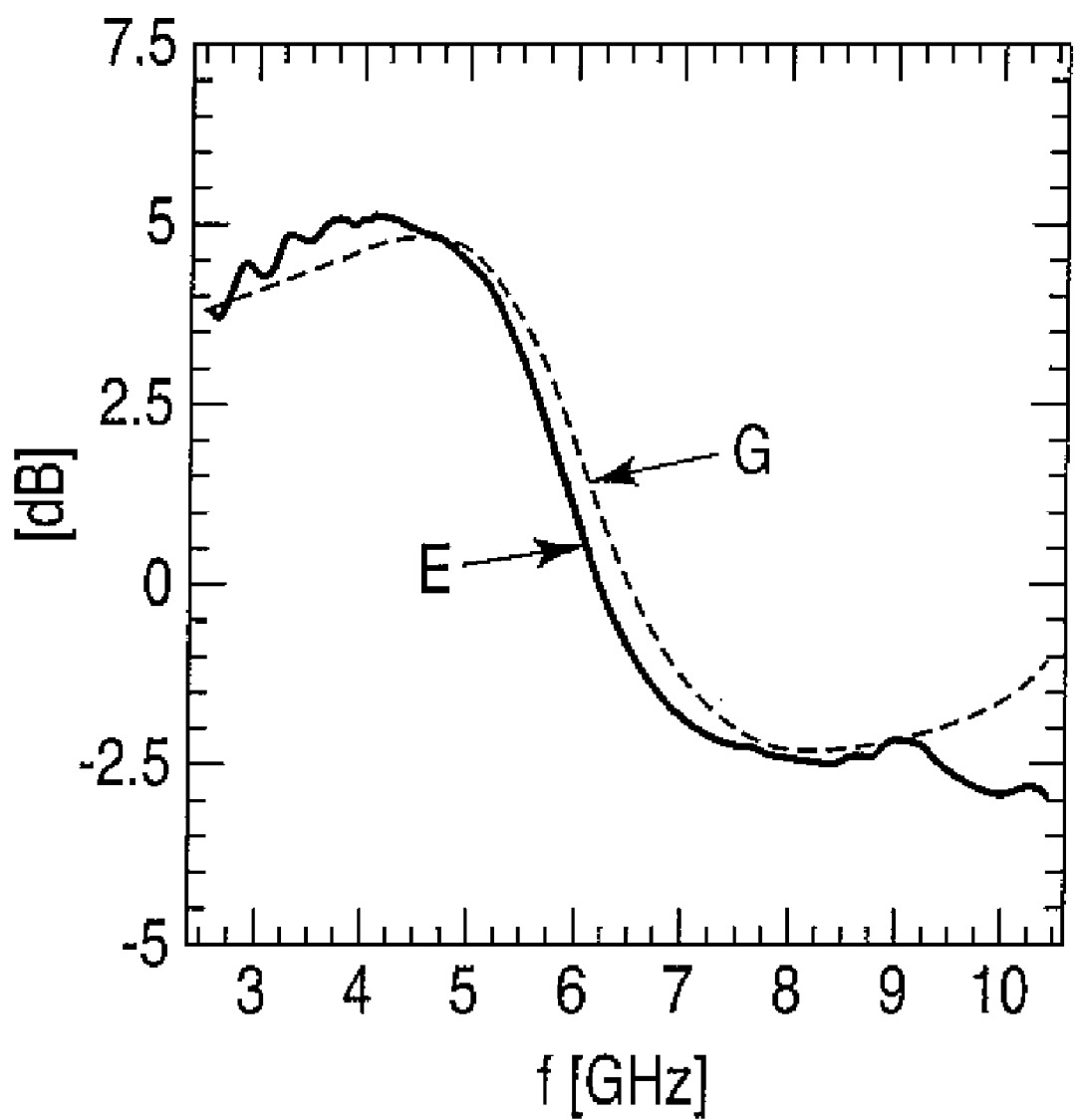
F I G. 15

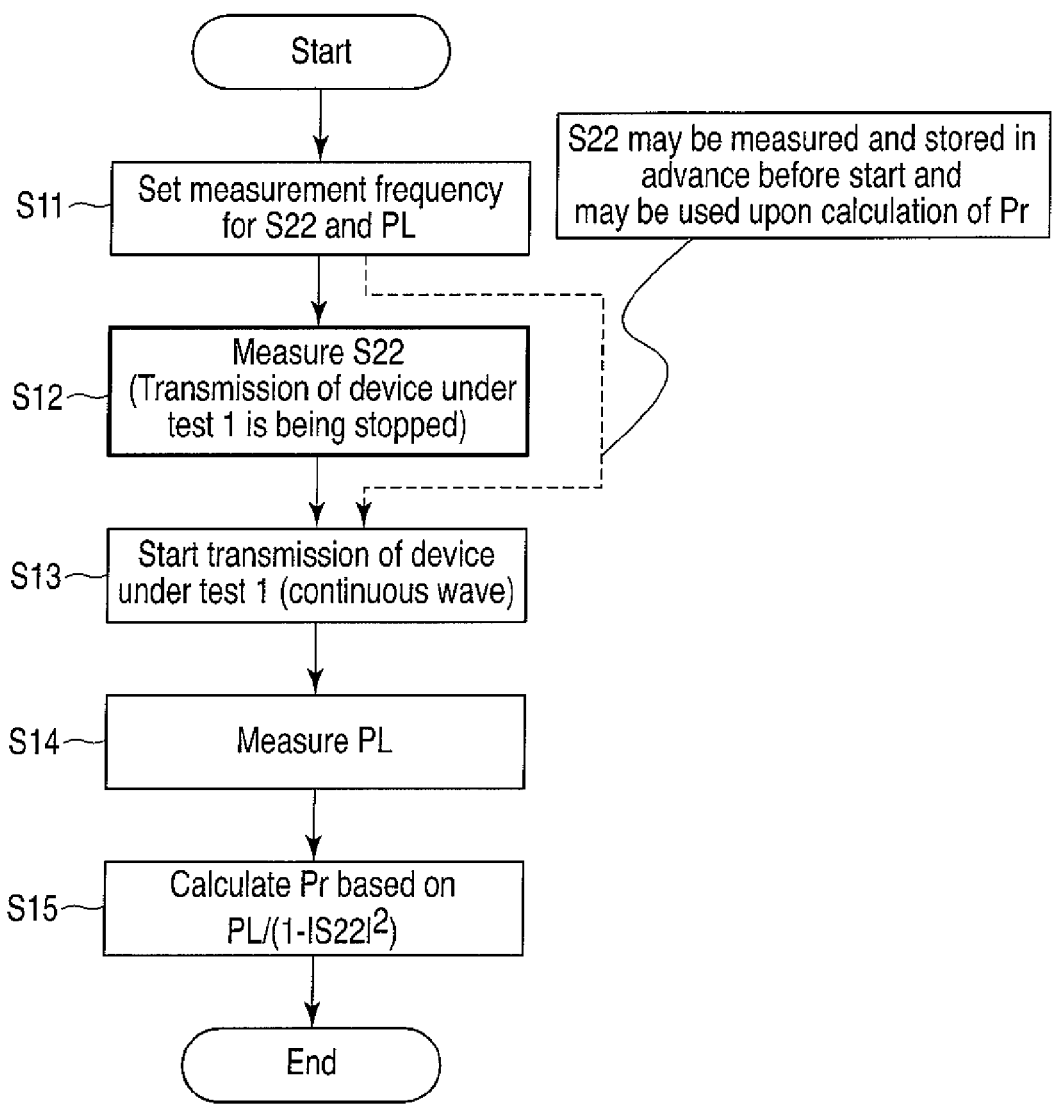
F I G. 20

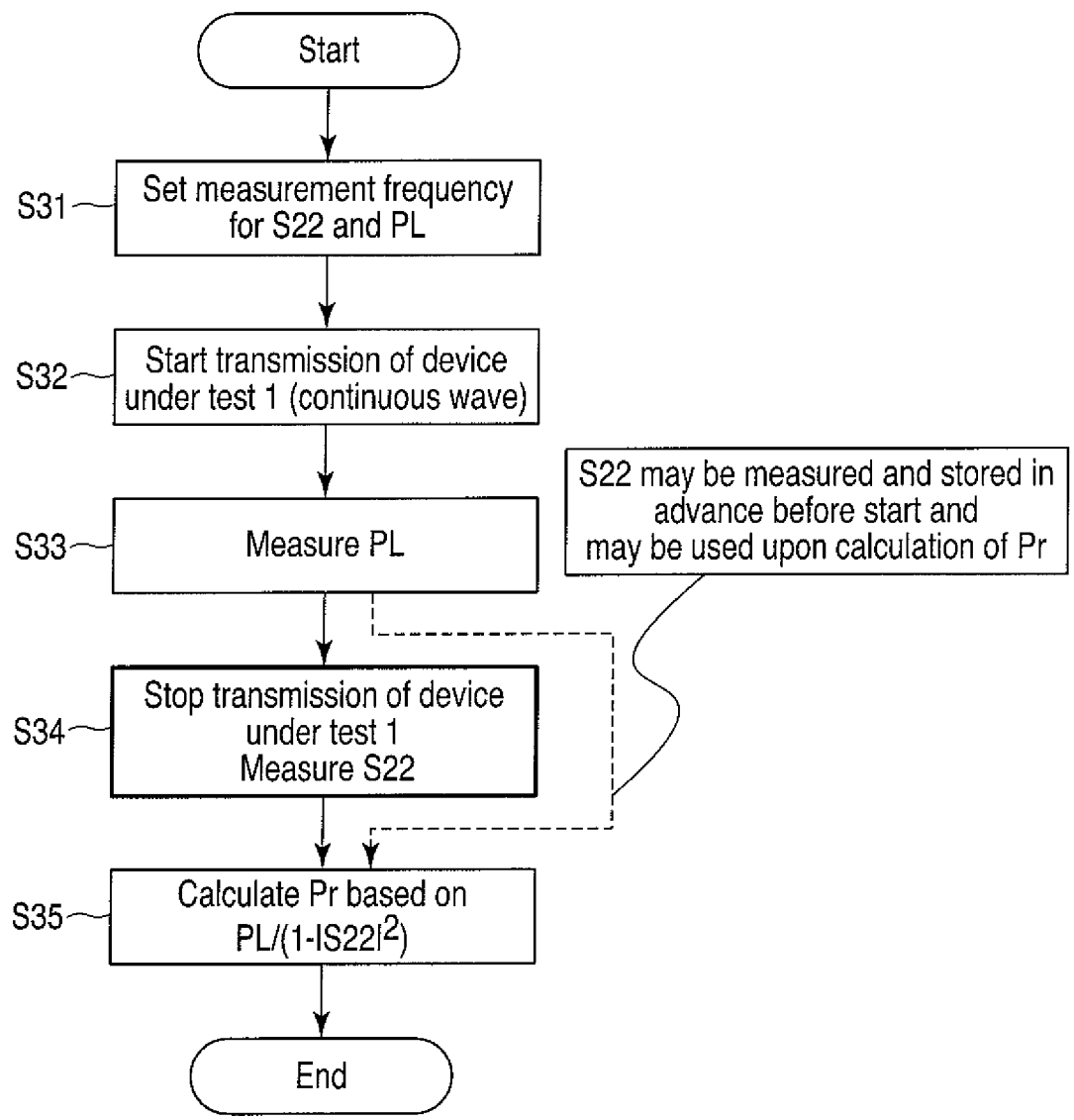
F I G. 21

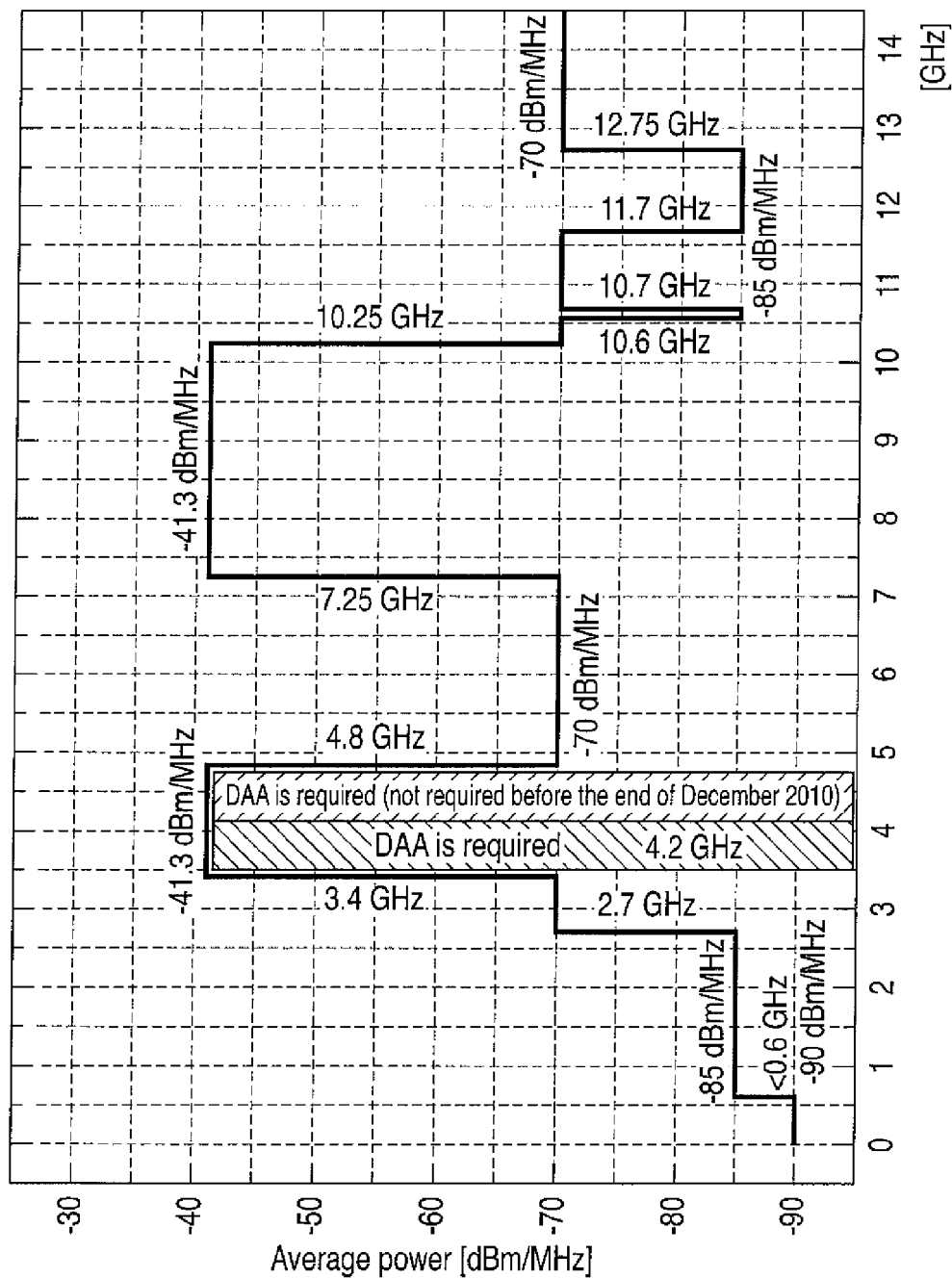
F I G. 27

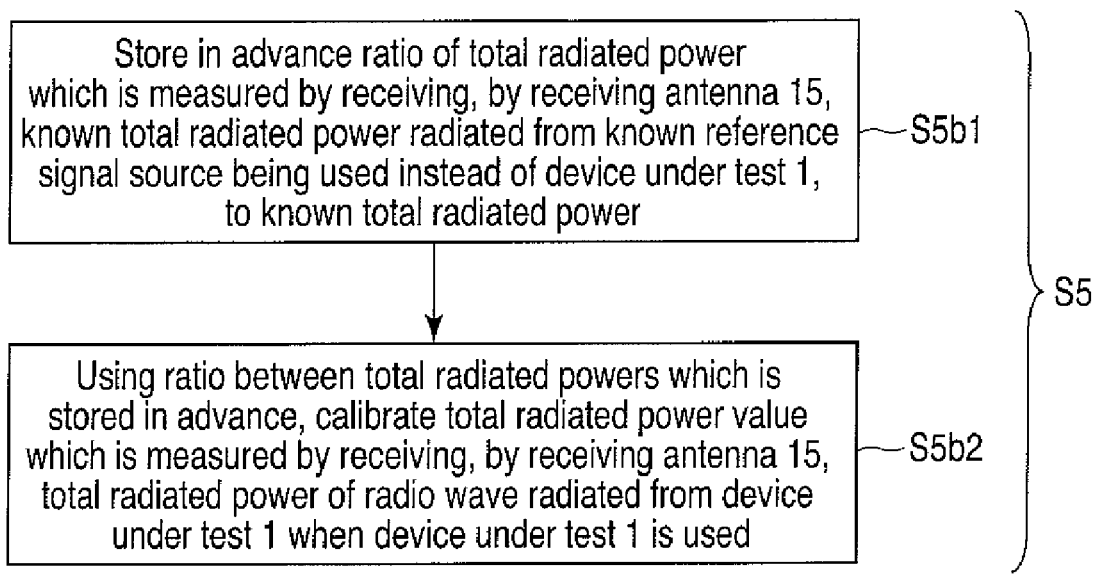
F I G. 31

METHOD, COUPLER AND APPARATUS FOR MEASURING RADIATED POWER

CROSS REFERENCE TO RELATED APPLICATIONS

This is a Continuation Application of PCT Application No. PCT/JP2008/067315, filed Sep. 25, 2008, which was published under PCT Article 21(2) in Japanese.

This application is based upon and claims the benefit of priority from prior Japanese Patent Application No. 2007-253643, filed Sep. 28, 2007, the entire contents of which are incorporated herein by reference.

BACKGROUND OF THE INVENTION

1. Field of the Invention

The present invention relates to a method for measuring a radiation power, a coupler for measuring a radiation power, and an apparatus for measuring a radiation power. More particularly, the present invention relates to a method for measuring a radiation power, a coupler for measuring a radiation power, and an apparatus for measuring a radiation power, wherein a technology for measuring a radiation power of, for example, a small wireless communication terminal serving as a device under test, with a simple configuration, in a short time, and with high sensitivity is adopted.

2. Description of the Related Art

With the coming of a ubiquitous network environment, a rapid increase in very small wireless communication terminals such as Radio frequency identification tags (RFIDs) and UWB (Ultra-wideband) and BAN (Body Area Network) related radio devices are expected.

Many of these devices do not have test terminals as do conventional radio devices, due to dimensional restrictions and economical reasons. Thus, there is a need to receive radio waves radiated from the devices and conduct tests on the radio waves.

Particularly, in small wireless communication terminals such as those described above, radiation power thereof is strictly defined in consideration of its influence on, e.g., other communications or human bodies. Hence, the measurement of radiation power is an important test item.

Radiated powers include equivalent isotropically radiation power (EIRP) in any direction and total radiation power (TRP) which is radiated in the entire space.

Of them, for EIRP, a measuring apparatus is complicated and measurement requires a long time and thus TRP is handled more and more.

Methods of measuring TRP used so far include the following known methods:

(1) a spherical scanning method in which a spherical surface that envelopes a device under test (DUT) is scanned with a probe to measure radiation powers at mesh points and the radiation powers at the mesh points are integrated;

(2) a method in which in a room covered with a metal a radio wave radiated from a device under test is agitated by rotation of metal blades to generate a random field and total radiation power from the device under test is estimated based on a statistical technique;

(3) a method in which total radiation power from a device under test is measured using an apparatus called a G-TEM cell that generates a TEM wave therein by a pyramid-like space covered with a metal film and a radio wave absorber; and (4) a method using an electromagnetic coupling apparatus that has a plurality of antennas which configure array antennas, an isolator and a phase shifter which are connected to the antennas, a combiner that combines signals at the array antennas, etc., and that measures total radiation power from a device under test which is put on a center line of the array.

The spherical scanning method in (1) is disclosed in the following Non-Patent Document 1 and Non-Patent Document 2.

Also, the electromagnetic coupling apparatus in (4) is disclosed in the following Patent Document 1.

A technology for adjusting, when a device under test such as a mobile phone is contained in an electromagnetic shielding box and a performance test is performed, the position of the device under test is disclosed in the following Patent Document 2 filed by the same applicant as the assignee of the present application.

Patent Document 1

Japanese Patent No. 3436669 (Jpn. Pat. Appln. KOKAI Publication No. 11-133079)

Non-Patent Document 1

IEIC Technical Report, AP2002-61, pp. 29-34, July 2002, "Simplified High Accuracy Measuring Method for Radio Equipment Using Integral Antennas: Radiated RF Power Measurement Using a Spherical Positioner (Part 1)", Nojima Tomoyuki, Nakajima Kyoichi Non-Patent Document 2

IEIC Technical Report, AP2003-85, pp. 125-130, July 2003, "Simplified High Accuracy Measuring Method for Radio Equipment Using Integral Antennas: Radiated RF Power Measurement Using a Spherical Positioner (Part 2)", Nojima Tomoyuki, Nakajima Kyoichi Patent Document 2

Jpn. Pat. Appln. KOKAI Publication No. 2006-322921

BRIEF SUMMARY OF THE INVENTION

The spherical scanning method in (1) which is disclosed in Non-Patent Document 1 and Non-Patent Document 2 as described above, although allowing measurement with high accuracy, has problems that large equipment (a radio wave non-reflection room, a spherical scanner, etc.) is required and measurement requires a long time.

Furthermore, this spherical scanning method has a problem that reception sensitivities at respective measurement points are very small, precluding spurious measurement, since radio waves that are radiated in a limited part of the entire space are received and powers are obtained and then the powers are summed.

For example, in UWB devices, it is defined that the continuous wave spurious is −90 dBm/MHz and the peak power of impulse spurious is −84 dBm/MHz, which is very difficult to measure by the measuring method.

On the other hand, the method in (2) in which in a room covered with a metal a radio wave is agitated by rotation of metal blades, although having an advantage that no large radio wave non-reflection room is required, has such problems that fuzziness in conformity between a random field which is artificially generated and a theoretical probability model and an estimation is made based on a statistical process and thus not only the degree of uncertainty of results is high but also measurement requires a long time.

The method in (2) also has a problem that spurious measurement is difficult as with the spherical scanning method in (1).

The G-TEM cell in (3) also has troublesome problems that it is difficult to ensure the homogeneity of internal electric field distribution and, in addition, in order to measure total radiation power a two-axis turn table needs to be included in the G-TEM cell so that the orientation of a device under test can be changed in all directions.

The method in (4) which is disclosed in Patent Document 1 as described above also has problems that, since a plurality of antennas, an isolator and a phase shifter which are connected to the antennas, a combiner that combines signals at the array antennas, etc., are required, a system is complicated expensively and an antenna of a device under test is limited to a dipole system.

The method in (4) also has a problem that spurious measurement is difficult as with the spherical scanning method in (1).

The present invention solves these problems and provides a method for measuring a radiation power, a coupler for measuring a radiation power, and an apparatus for measuring a radiation power, wherein total radiation power (TRP) can be measured with a simple configuration, in a short time, and with high sensitivity.

In order to achieve the above object, according to a first aspect of the present invention, there is provided a method for measuring a radiation power comprising:

a step (S1) of preparing an elliptical mirror (10) having a closed space (12) which has an elliptical spherical shape and which is enclosed by a metal wall surface (11), the elliptical spherical shape being obtained by rotating an ellipse by a predetermined angle about an axis line passing through two focal points (F1, F2) thereof;

a step (S2) of placing a device under test (1) which can radiate a radio wave, in a position of one of the two focal points (F1, F2) in the closed space (12) of the elliptical mirror (10) such that a center of radiation of a radio wave therefrom substantially coincides with the one of the focal points (F1);

a step (S3) of placing a receiving antenna (15) in an position of an other one of the two focal points (F1, F2) in the closed space (12) of the elliptical mirror (10); and a step (S4) of causing the device under test (1) disposed in the position of the one focal point (F1) to radiate a radio wave and causing the radio wave radiated from the device under test (1) to be reflected at the wall surface (11) to allow the receiving antenna (15) disposed in the position of the other focal point (F2) to receive the radio wave in the closed space (12) of the elliptical mirror (10), and then measuring total radiation power of the radio wave radiated from the device under test (1) at a measurement end of the receiving antenna (15) in accordance with an output signal from the receiving antenna (15).

In order to achieve the above object, according to a second aspect of the present invention, there is provided the method for measuring a radiation power according to the first aspect, wherein the step (S4) of measuring total radiation power at a measurement end of the receiving antenna (15) comprises:

a step (S5) of measuring a received power value PL of the receiving antenna (15) through the measurement end of the receiving antenna (15) under a condition that a continuous wave having a predetermined measurement frequency is radiated from the device under test (1);

a step (S6) of applying power having the predetermined measurement frequency to the measurement end of the receiving antenna (15) under a condition that the radio wave radiation from the device under test (1) is stopped, and measuring power reflected from the receiving antenna (15) through the measurement end, whereby a reflection coefficient value S22 of the receiving antenna (15) is measured; and a step (S7) of calculating power proportional to a total radiation power value Pr of the device under test (1), based on the value of received power PL which is measured in the step of measuring a received power value PL of the receiving antenna (15), and the reflection coefficient value S22 which is measured in the step of measuring a reflection coefficient value S22 of the receiving antenna (15), by a following equation:

$$PL/(1-|S22|^2).$$

In order to achieve the above object, according to a third aspect of the present invention, there is provided the method for measuring a radiation power according to the first aspect, wherein the step (S4) of measuring total radiation power at a measurement end of the receiving antenna (15) comprises:

a step (S5a) of, for each of a plurality of measurement frequencies which are predetermined in a predetermined frequency range, with a continuous wave which has the predetermined measurement frequency being radiated from the device under test (1), sequentially measuring received power PL of the receiving antenna (15) through the measurement end of the receiving antenna (15);

a step (S6a) of, for each of said plurality of measurement frequencies which are predetermined in the predetermined frequency range, applying power having the predetermined measurement frequency to the measurement end of the receiving antenna (15) and sequentially measuring power reflected from the receiving antenna (15) through the measurement end, whereby the reflection coefficient value S22 of the receiving antenna (15) is sequentially measured; and a step (S7a) of, based on the received power PL which is sequentially measured for each of said plurality of measurement frequencies and the reflection coefficient value S22 which is sequentially measured for each of said plurality of measurement frequencies, sequentially calculating power proportional to a total radiation power value Pr for each of said plurality of measurement frequencies by a following equation:

$$PL/(1-|S22|^2).$$

In order to achieve the above object, according to a fourth aspect of the present invention, there is provided the method for measuring a radiation power according to the first aspect, further comprising:

a step (S8) of storing in advance a spectrum mask of a predetermined standard for radio waves radiated from the device under test (1), the spectrum mask including predetermined frequencies and predetermined output intensities; and a step (S9) of making a pass/fail determination by a comparison with the spectrum mask, as to whether the power proportional to the total radiation power value Pr which is calculated in the step of calculating power proportional to a total radiation power value Pr of the device under test (1) satisfies the predetermined standard.

In order to achieve the above object, according to a fifth aspect of the present invention, there is provided the method for measuring a radiation power according to the first aspect, wherein the step (S4) of measuring total radiation power at a measurement end of the receiving antenna (15) comprises:

a step (S41) of adjusting a position of the device under test (1) along at least one of three-dimensional coordinate axes which intersect one another;

a step (S42) of, each time the position of the device under test (1) is adjusted in the step (S41) of adjusting a position, with radio wave radiation from the device under test (1) being stopped, applying power having a predetermined measurement frequency to the measurement end of the receiving antenna (15) and measuring power reflected from the receiving antenna (15) through the measurement end, whereby a value corresponding to a reflection coefficient value S22 of the receiving antenna (15) is measured;

a step (S43) of comparing the value corresponding to a reflection coefficient value S22 of the receiving antenna (15) which is measured in the step (S42) of measuring a value corresponding to a reflection coefficient value S22 of the receiving antenna (15), with a preset threshold value;

a step (S44) of setting, as the reflection coefficient value S22, a value corresponding to a reflection coefficient value S22 which is measured in the step (S42) of measuring a value corresponding to a reflection coefficient value S22 of the receiving antenna (15) and which is determined, by a comparison in the step (S43) of comparing with a threshold value, to be the threshold value or less;

a step (S45) of, with a continuous wave which has the predetermined measurement frequency being radiated from the device under test (1), measuring a received power value PL of the receiving antenna (15) through the measurement end of the receiving antenna (15); and a step (S46) of, based on the received power value PL of the receiving antenna (15) 15 which is measured in the step (S45) of measuring a received power value PL of the receiving antenna (15), and the value corresponding to a reflection coefficient value S22 which is set as the reflection coefficient value S22 in the step (S44) of setting as the reflection coefficient value S22, starting calculation of power proportional to a total radiation power value Pr of the device under test (1) by a following equation:

$$PL/(1-|S22|^2).$$

In order to achieve the above object, according to a sixth aspect of the present invention, there is provided the method for measuring a radiation power according to the first aspect, wherein in the step (S4) of measuring total radiation power at a measurement end of the receiving antenna (15), a signal corresponding to a primary wave that is radiated from the device under test (1) and reflected once at the wall surface (11) and then reaches the position of the other focal point (F2), is extracted from output signals from the receiving antenna (15) and total radiation power of the device under test (1) is measured.

In order to achieve the above object, according to a seventh aspect of the present invention, there is provided the method for measuring a radiation power according to the second aspect, wherein the step (S5) of measuring a received power value PL of the receiving antenna (15) comprises:

a step (S5b1) of storing in advance a ratio of total radiation power which is measured by receiving, by the receiving antenna (15), known total radiation power which is transmitted from a known reference signal source being used instead of the device under test (1), to the known total radiation power; and a step (S5b2) of calibrating a total radiation power value which is measured by receiving, by the receiving antenna (15), total radiation power of a radio wave radiated from the device under test (1) when the device under test (1) is used, using the ratio of total radiation power which is measured by receiving, by the receiving antenna (15), known total radiation power to the known total radiation power, which is stored in advance in the step (S5b1) of storing in advance a ratio of total radiation power which is measured by reception by the receiving antenna (15) to the known total radiation power.

In order to achieve the above object, according to an eighth aspect of the present invention, there is provided the coupler (21) for measuring a radiation power configured to be able to support a device under test (1) which can radiate a radio wave and a receiving antenna (15) which receives the radio wave radiated from the device under test (1) in a closed space (12) enclosed by a metal wall surface (11), receive by the receiving antenna (15) the radio wave radiated from the device under test (1), and output a received signal of the receiving antenna (15) externally, the coupler (21) comprising:

an elliptical mirror (10) having the closed space (12) formed in a an elliptical spherical shape which is obtained by rotating an ellipse by a predetermined angle about an axis line passing through two focal points (F1, F2) thereof;

a device under test supporting member (50) which supports the device under test (1) in a position of one of the two focal points (F1, F2) in the closed space (12) of the elliptical mirror (10) such that a center of radiation of a radio wave therefrom substantially coincides with the focal point; and a receiving antenna supporting member (55) which supports the receiving antenna (15) in a position of an other one of the two focal points (F1, F2) in the closed space (12) of the elliptical mirror (10) such that a center position thereof substantially coincides with the other focal point (F2), wherein in the closed space (12) of the elliptical mirror (10), a radio wave radiated from the device under test (1) which is supported by the device under test supporting member (50) is caused to be reflected at the wall surface (11) to allow the receiving antenna (15) which is supported by the receiving antenna supporting member (55) to receive the radio wave.

In order to achieve the above object, according to a ninth aspect of the present invention, there is provided the coupler (21) for measuring a radiation power according to claim 8, further comprising a radio wave absorber (70) in the closed space (12) of the elliptical mirror (10) so that multiple reflections of a radio wave radiated from the device under test (1) can be suppressed, the radio wave absorber (70) being provided in a region other than areas surrounding a portion where the device under test (1) is supported and a portion where the receiving antenna (15) is supported, and along a plane including the two focal points (F1, F2).

In order to achieve the above object, according to a tenth aspect of the present invention, there is provided an apparatus for measuring a radiation power comprising:

a coupler (21) for measuring a radiation power configured to be able to support a device under test (1) which can radiate a radio wave and a receiving antenna (15) which receives the radio wave radiated from the device under test (1) in a closed space (12) enclosed by a metal wall surface (11), receive by the receiving antenna (15) the radio wave radiated from the device under test (I), and output a received signal of the receiving antenna (15) externally; and a power measuring unit (60) which measures total radiation power of a radio wave radiated from the device under test (1), from a received signal of the receiving antenna (15) to be outputted external to the coupler (21) for measuring a radiation power, wherein the coupler (21) for measuring a radiation power comprises:

an elliptical mirror (10) having the closed space (12) formed in a an elliptical spherical shape which is obtained by rotating an ellipse by a predetermined angle about an axis line passing through two focal points (F1, F2) thereof;

a device under test supporting member (50) which supports the device under test (1) in a position of one of the two focal points (F1, F2) in the closed space (12) of the elliptical mirror (10) such that a center of radiation of a radio wave therefrom substantially coincides with the focal point; and a receiving antenna supporting member (55) which supports the receiving antenna (15) in a position of an other one of the two focal points (F1, F2) in the closed space (12) of the elliptical mirror (10) such that a center position thereof substantially coincides with the other focal point (F2), wherein in the closed space (12) of the elliptical mirror (10), a radio wave radiated from the device under test (1) which is supported by the device under test supporting member (50) is caused to be reflected at the wall surface (11) to allow the receiving antenna (15) which is supported by the receiving antenna supporting member (55) to receive the radio wave, and the power measuring unit (60) can measure total radiation power of a radio wave radiated from the device under test (1) which is supported by the device under test supporting member (50), in accordance with an output signal received by the receiving antenna (15) which is supported by the receiving antenna supporting member (55) of the coupler (21) for measuring a radiation power.

In order to achieve the above object, according to an eleventh aspect of the present invention, there is provided the apparatus for measuring a radiation power according to the tenth aspect, wherein the power measuring unit (60) comprises:

a reflection coefficient measurement module (60*a*) which measures a reflection coefficient value S22 of the receiving antenna (15) with radio wave radiation from the device under test (1) being stopped, by applying power having a predetermined measurement frequency to a measurement end of the receiving antenna (15) and measuring power reflected from the receiving antenna (15) through the measurement end, the device under test (1) being supported by the device under test supporting member (50) of the coupler (21) for measuring a radiation power and the receiving antenna (15) being supported by the receiving antenna supporting member (55) of the coupler (21) for measuring a radiation power;

a received power measurement module (60*b*) which measures a value of received power PL of the receiving antenna (15) through the measurement end of the receiving antenna (15) with a continuous wave having the predetermined measurement frequency being radiated from the device under test (1); and a total radiation power calculation module (60*c*) which calculates power proportional to a total radiation power value Pr of the device under test (1), based on the reflection coefficient value S22 measured by the reflection coefficient measurement module (60*a*) and the value of received power PL measured by the received power measurement module (60*b*), by a following equation:

$$PL/(1-|S22|^2).$$

In order to achieve the above object, according to a twelfth aspect of the present invention, there is provided the apparatus for measuring a radiation power according to the eleventh aspect, wherein the reflection coefficient measurement module (60*a*) sequentially measures a reflection coefficient value S22 for each of a plurality of measurement frequencies by applying power having the predetermined measurement frequency to the measurement end of the receiving antenna (15) and measuring power reflected from the receiving antenna (15) through the measurement end, said plurality of measurement frequencies being predetermined in a predetermined frequency range, the received power measurement module (60*b*) sequentially measures received power PL of the receiving antenna (15) through the measurement end of the receiving antenna (15) for each of said plurality of measurement frequencies, with a continuous wave having the predetermined measurement frequency being radiated from the device under test (1), said plurality of measurement frequencies being predetermined in the predetermined frequency range, and the total radiation power calculation module (60*c*) sequentially calculates power proportional to a total radiation power value Pr for each of said plurality of measurement frequencies, based on the reflection coefficient value S22 which is sequentially measured by the reflection coefficient measurement module (60*a*) for each of said plurality of measurement frequencies which are predetermined in the predetermined frequency range and the value of received power PL which is sequentially measured by the received power measurement module (60*b*) for each of said plurality of measurement frequencies which are predetermined in the predetermined frequency range, by a following equation:

$$PL/(1-|S22|^2).$$

In order to achieve the above object, according to a thirteenth aspect of the present invention, there is provided the apparatus for measuring a radiation power according to the twelfth aspect, wherein the power measuring unit (60) further comprises:

a storage module (60*d*) which stores in advance a spectrum mask of a predetermined standard for radio waves radiated from the device under test (1), the spectrum mask including predetermined frequencies and predetermined output intensities; and a pass/fail determination module (60*e*) which makes a pass/fail determination as to whether power proportional to a total radiation power value Pr for each of said plurality of measurement frequencies which is sequentially calculated by the total radiation power calculation module (60*c*) satisfies the predetermined standard, by a comparison with the spectrum mask stored in the storage module (60*d*).

In order to achieve the above object, according to a fourteenth aspect of the present invention, there is provided the apparatus for measuring a radiation power according to the eleventh aspect, wherein the coupler (21) for measuring a radiation power further comprises a position adjustment mechanism (52) which adjusts a position of the device under test (1) supported by the device under test supporting member (50), along at least one of three-dimensional coordinate axes, the power measuring unit (60) further comprises a comparison module (60*f*) which compares a value corresponding to the reflection coefficient value S22 which is measured by the reflection coefficient measurement module (60*a*) each time the position of the device under test (1) is adjusted by the position adjustment mechanism (52), with a preset threshold value, and the total radiation power calculation module (60*c*) starts calculation of power proportional to a total radiation power value Pr of the device under test (1) using, as the reflection coefficient value S22, a value corresponding to the reflection coefficient value S22 which is determined by the comparison module to be the threshold value or less.

In order to achieve the above object, according to a fifteenth aspect of the present invention, there is provided the apparatus for measuring a radiation power according to the tenth aspect, wherein the power measuring unit (60) comprises:

a spectrum analysis module (61) which obtains spectrum data from an output signal received by the receiving antenna (15) with a short-pulse radio wave being radiated from the device under test (1) which is supported by the device under test supporting member (50) of the coupler (21) for measuring a radiation power, the receiving antenna (15) being supported by the receiving antenna supporting member (55) of the coupler (21) for measuring a radiation power;

a time waveform data calculation module (62) which performs an inverse Fourier transform operation on the spectrum data obtained by the spectrum analysis module (61) and calculates time waveform data for the output signal from the receiving antenna (15);

a primary wave extraction module (64) which extracts time waveform data of a primary wave from the time waveform data calculated by the time waveform data calculation module (62), the primary wave being the short-pulse radio wave which is radiated from the device under test (1), reflected once at the wall surface (11) in the elliptical spherical closed space (12) of the coupler (21) for measuring a radiation power, and reaches the receiving antenna (15);

a primary wave spectrum calculation module (64) which performs a Fourier transform process on the time waveform data of the primary wave and thereby obtains spectrum data of the primary wave, the time waveform data of the primary wave being extracted by the primary wave extraction module (63); and a radiation power calculation module (65) which calculates total radiation power of the device under test (1) from the spectrum data of the primary wave which is calculated by the primary wave spectrum calculation module (64).

In order to achieve the above object, according to a sixteenth aspect of the present invention, there is provided the apparatus for measuring a radiation power according to eleventh aspect, wherein the power measuring unit (60) further comprises:

a storage module (60g) which stores in advance a ratio of total radiation power which is calculated by the total radiation power calculation module (60c) by receiving, by the receiving antenna (15), known total radiation power which is transmitted from a transmitting antenna of a known reference signal source being used instead of the device under test (1), to the known total radiation power transmitted from the transmitting antenna of the known reference signal source; and a calibration module (60h) which calibrates a total radiation power value which is calculated by the total radiation power calculation module (60c) by receiving, by the receiving antenna (15), total radiation power of a radio wave radiated from the device under test (1) when the device under test (1) is used, using the ratio of total radiation power which is calculated by the total radiation power calculation module (60c) by receiving, by the receiving antenna (15), the known total radiation power transmitted from the transmitting antenna of the known reference signal source, to the known total radiation power which is stored in the storage module (60g).

As described above, in the method for measuring a radiation power in accordance with an aspect of the present invention, a device under test 1 which can radiate a radio wave is disposed in a position of one focal point F1 of an elliptical mirror 10 having a closed space 12 which has an elliptical spherical shape obtained by rotating an ellipse by a predetermined angle about an axis line passing through two focal points F1 and F2 thereof and which is enclosed by a metal wall surface 11, such that the center of radiation of a radio wave therefrom substantially coincides with the focal point F1, and a radio wave radiated from the device under test (1) is caused to be reflected at the wall surface 11 to allow a receiving antenna 15 disposed in a position of the other focal point F2 of the elliptical mirror 10 to receive the radio wave, and then radiation power from the device under test 1 is measured in accordance with an output signal from the receiving antenna 15.

Hence, the receiving side can measure total radiation power with a simple configuration in which only one receiving antenna is disposed, and in a short time and with high sensitivity by, in principle, allowing the receiving antenna to instantaneously and intensively receive total radiation power of a radio wave radiated from a device under test 1 and measuring the total radiation power in accordance with an output signal from the receiving antenna.

Furthermore, in accordance with an aspect of the present invention, only by measuring a reflection coefficient value S22 of the receiving antenna and a value of received power PL of the receiving antenna, total radiation power of a radio wave radiated from the device under test 1 can be calculated.

Furthermore, in accordance with an aspect of the present invention, only by sequentially measuring a reflection coefficient value S22 and received power PL for each of a plurality of predetermined measurement frequencies, a total radiation power value from the device under test 1 can be sequentially calculated for each of the plurality of measurement frequencies.

Furthermore, in accordance with an aspect of the present invention, in advance, by storing in advance a spectrum mask of a predetermined standard including predetermined frequencies and predetermined output intensities, for a radio wave radiated from the device under test 1, only by calculating a total radiation power value for each of the plurality of measurement frequencies, a pass/fail determination as to whether the calculated total radiation power value satisfies the predetermined standard can be made easily and in a short time, by a comparison with the spectrum mask.

Furthermore, in the method for measuring a radiation power in accordance with an aspect of the present invention, the position of the device under test 1 is adjusted and after a value corresponding to a reflection coefficient value S22 which is measured each time the position of the device under test 1 is adjusted is determined to be better than a preset threshold value, calculation of total radiation power of a radio wave radiated from the device under test 1 starts. Thus, calculation of total radiation power with high accuracy can be performed.

Furthermore, in the apparatus for measuring a radiation power in accordance with an aspect of the present invention, using a ratio of total radiation power which is calculated by the total radiation power calculation module 60c by receiving, by the receiving antenna 15, known total radiation power which is transmitted from a transmitting antenna of a known reference signal source, to the known total radiation power which is stored in the storage module 60g, a total radiation power value which is calculated by the total radiation power calculation module 60c by receiving, by the receiving antenna 15, total radiation power of a radio wave radiated from the device under test 1 when the device under test 1 is used or power proportional to a total radiation power value Pr of the device under test 1 which is calculated by the total radiation power calculation module 60c is calibrated, whereby measurement of total radiation power with high accuracy can be performed.

The apparatus for measuring a radiation power in accordance with an aspect of the present invention can be configured to be small in size and have portability and is simple and low cost, and thus, can be easily introduced to the production lines of mobile phones and various small radios.

Moreover, the method for measuring a radiation power and the apparatus for measuring a radiation power in accordance with an aspect of the present invention handle total radiation power and thus can be applied to antennas having various directivities without limiting the directivity of an antenna of a device under test 1 to be used.

BRIEF DESCRIPTION OF THE SEVERAL VIEWS OF THE DRAWING

FIG. 5 is a cross-sectional view of a main part illustrated to describe the configuration of the coupler (21) for measuring a radiation power used in the method for measuring a radiation power and the apparatus for measuring a radiation power according to the sixth embodiment of the present invention.

FIG. 6 is an exploded cross-sectional view and an assembly cross-sectional view of a main part illustrated to describe an exemplary configuration for preventing a radio wave leakage from the coupler (21) for measuring a radiation power which is used in the method for measuring a radiation power and the apparatus for measuring a radiation power according to the sixth embodiment of the present invention.

FIG. 7 is a diagram illustrated to describe exemplary configurations of a device under test supporting member (50) and a receiving antenna supporting member (55) of the coupler (21) for measuring a radiation power which is used in the method for measuring a radiation power and the apparatus for measuring a radiation power according to the sixth embodiment of the present invention.

FIG. 8 is a block diagram illustrated to describe an exemplary configuration of a power measuring unit (60) used in the method for measuring a radiation power and the apparatus for measuring a radiation power according to the sixth embodiment of the present invention.

FIG. 12 is a diagram illustrated to describe reflection characteristics of a dipole antenna for a primary wave and free space, which is used in a method for measuring a radiation power and an apparatus for measuring a radiation power in accordance with an aspect of the present invention.

FIG. 13 is a diagram illustrated to describe an impulse response for when a standard antenna is used in the method for measuring a radiation power and the apparatus for measuring a radiation power in accordance with an aspect of the present invention.

FIG. 14 is a diagram illustrated to describe an impulse response for when an antenna of a different length than the standard antenna used in the method for measuring a radiation power and the apparatus for measuring a radiation power in accordance with an aspect of the present invention is used.

FIG. 15 is a diagram illustrated to describe, for when antennas of different lengths are used in the method for measuring a radiation power and the apparatus for measuring a radiation power in accordance with an aspect of the present invention, a ratio between measurement results for a primary wave and a ratio between radiation powers of the two antennas in free space.

FIG. 20 is a flowchart illustrated to describe a first modification of the method for measuring a radiation power according to the second embodiment of the present invention.

FIG. 21 is a flowchart illustrated to describe a second modification of the method for measuring a radiation power according to the second embodiment of the present invention.

FIG. 27 is a UWB spectrum mask illustrated to describe the method for measuring a radiation power according to the fourth embodiment of the present invention.

FIG. 31 is a flowchart illustrated to describe an example of specific operations in a method for measuring a radiation power according to the seventh embodiment of the present invention.

DETAILED DESCRIPTION OF THE INVENTION

Embodiments of a method for measuring a radiation power, a coupler for measuring a radiation power, and an apparatus for measuring a radiation power in accordance with an aspect of the present invention will be described below based on the drawings.

First, a method for measuring a radiation power in accordance with an aspect of the present invention will be described.

Figure 1:
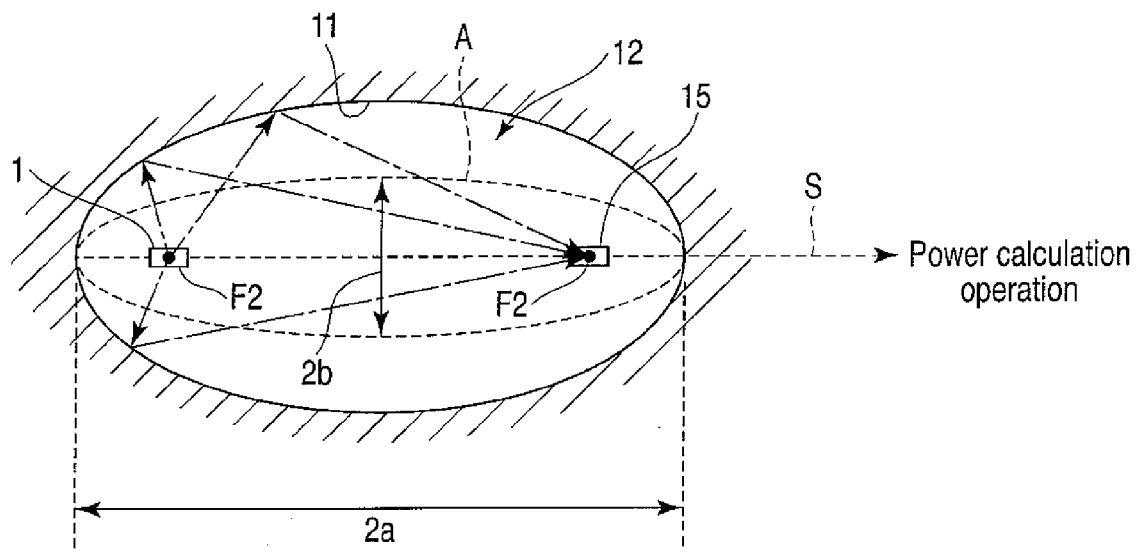
FIG. 1 is a schematic diagram illustrated to describe configurations of an elliptical mirror (10), a device under test (1), and a receiving antenna (15) which are used in a method for measuring a radiation power and an apparatus for measuring a radiation power according to first and second embodiments of the present invention.

In the method for measuring a radiation power in accordance with an aspect of the present invention, an elliptical mirror 10 is used that has a closed space 12, such as that illustrated in FIG. 1, which has an elliptical spherical shape obtained by rotating an ellipse A by a predetermined angle, e.g., 360 degrees, about a long-axis (or short-axis) line passing through two focal points F1 and F2 thereof, and which is enclosed by a metal wall surface 11.

Namely, in the method for measuring a radiation power in accordance with an aspect of the present invention, a property that a light ray portion that geometric-optically passes through one focal point F1 and is reflected at the wall surface 11 in the closed space 12 enclosed by the metal wall surface 11 forming an elliptical space, using the elliptical mirror 10 having the two focal points F1 and F2 such as those illustrated in FIG. 1, always passes through the other focal point F2 is applied to measurement of radio wave power.

First Embodiment

Figure 16:
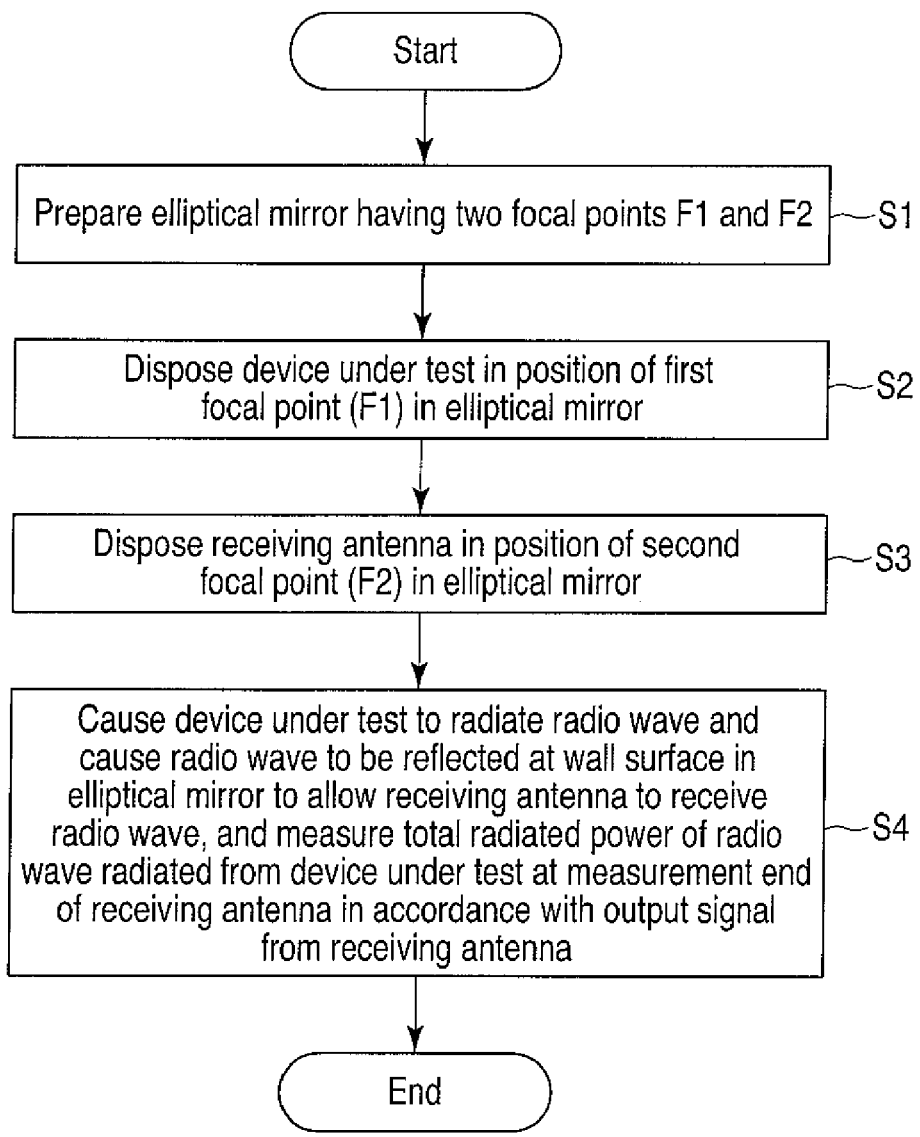
FIG. 16 is a flowchart illustrated to describe a method for measuring a radiation power according to the first embodiment of the present invention.

More specifically, in a method for measuring a radiation power according to a first embodiment of the present invention, as illustrated in FIG. 16, first, an elliptical mirror 10 is prepared that has, as described above, a closed space 12 which has an elliptical spherical shape obtained by rotating an ellipse by a predetermined angle about an axis line passing through two focal points F1 and F2 thereof and which is enclosed by a metal wall surface 11 (step S1).

Then, in the closed space 12 of the elliptical mirror 10 having the two focal points F1 and F2 which is prepared at step S1, a device under test 1 which can radiate a radio wave, such as a small wireless communication terminal, is disposed in the position of one of the two focal points F1 and F2, e.g., the focal point F1, on a rotation axis (long axis or short axis) line such that the center of radiation of a radio wave therefrom substantially coincides with the focal point F1 (step S2).

Subsequently, in the closed space 12 of the above-described elliptical mirror 10, a receiving antenna 15 is disposed in the position of the other one of the two focal points F1 and F2, e.g., the focal point F2, on the rotation axis (long axis or short axis) line such that the center of reception of a radio wave thereby substantially coincides with the other focal point F2 (step S3).

Then, the device under test 1 which is disposed, at step S3, in the position of the focal point F1 of the elliptical mirror 10 is caused to radiate a radio wave W therearound and the radio wave W radiated from the device under test 1 is caused to be reflected at the wall surface 11 of the elliptical mirror 10 to allow the receiving antenna 15 which is disposed, at step S2, in the position of the focal point F2 which is the other one of the two focal points F1 and F2 to receive the radio wave W and then total radiation power of the radio wave radiated from the device under test (1) is measured at a measurement end of the receiving antenna (15), in accordance with an output signal from the receiving antenna (15) (step S4).

The elliptical mirror 10 obtained by, as illustrated in FIG. 1, rotating the ellipse A with a long-axis length $2a$ and a short-axis length $2b$ 360 degrees about the axis passing through the two focal points F1 and F2 on the long axis (z-axis) is represented by the following equation.

$$(x^2/b^2)+(y^2/b^2)+(z^2/a^2)=1$$

Figure 2:
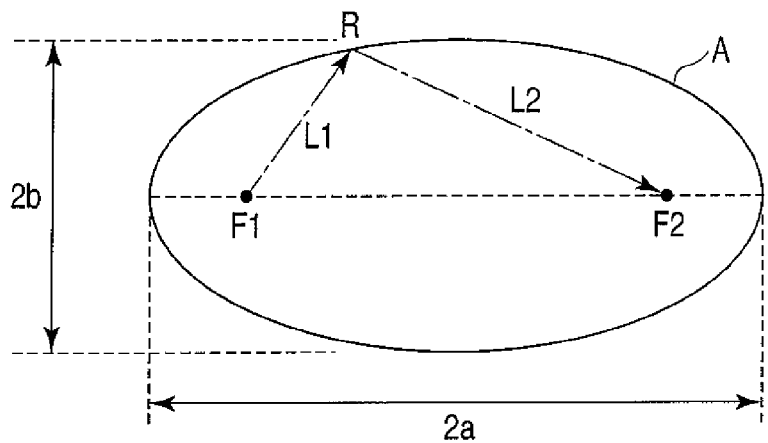
FIG. 2 is a diagram illustrated to describe characteristics of the elliptical mirror (10) used in the method for measuring a radiation power and the apparatus for measuring a radiation power according to the first and second embodiments of the present invention.

From the point of view of geometrical optics, when, as illustrated in FIG. 2, the distance from one focal point F1 to a reflection point R of the wall surface 11 is L1 and the distance from the reflection point R to the other focal pinot F2 is L2, a sum L thereof is:

$$L=L1+L2=2a$$

and thus all light rays that are radiated from the focal point F1 in any direction are gathered in the position of the other focal point F2 at the same timing, if the light rays are reflected once at the wall surface 11.

The eccentricity e of the ellipse A is:

$$e=[1-(b^2/a^2)]^{1/2}$$

and a coordinate z of the focal points F1 and F2 is represented by:

$$z=\pm f=\pm ae$$

Therefore, by performing a power detection process in accordance with an output signal S from the receiving antenna 15 which is disposed in the position of one focal point F2 in the elliptical mirror 10 having the two focal points F1 and F2, total radiation powers TRP of all those radio waves that are radiated therearound in any direction from the device under test 1 disposed in the position of the other focal point F1 can be found.

When it is assumed that the device under test 1 radiates a single-frequency continuous wave and power of a radio wave (direct wave) radiated in the direction of the receiving antenna 15 has a negligible level relative to radiation power of the device under test 1 and all those radio waves that are inputted to the receiving antenna 15 are absorbed by the receiving antenna 15 with no loss, by measuring power of an output signal S from the receiving antenna 15 by a power meter, etc., total radiation power TRP of the device under test 1 can be obtained.

In practice, there is a loss in the receiving antenna 15, a cable, etc. Thus, using, instead of the device under test 1, a signal generator serving as a reference item having known total radiation power Pr (dBm), total radiation power Pr' (dBm) is measured in advance from an output signal S from the receiving antenna 15, whereby a loss ΔP (=Pr'−Pr) is found. Then, by adding the loss ΔP=Pr'−Pr to an output signal Px' (dBm) obtained when measurement is performed using the device under test 1, total radiation power Px from the device under test 1 can be found properly.

Second Embodiment

When a radio wave that is radiated from the device under test 1 and reflected once at the wall surface 11 and reaches the receiving antenna 15 at the focal point F2 is a primary wave, inside the closed space 11 of the elliptical mirror 10 such as that described above, there are multiple reflections where a secondary wave being a radio wave which is scattered by the receiving antenna 15 having received the primary wave and is reflected again at the wall surface 11 and returns to the focal point F1 and is further reflected at the wall surface 11 and inputted to the receiving antenna 15 at the focal point F2, or higher-order radio waves are inputted to the receiving antenna 15.

When there are such multiple reflections, a large standing wave is set up inside the closed space 11 of the elliptical mirror 10 and an electromagnetic field has a complicated distribution and thus it becomes difficult to accurately measure total radiation power of a radio wave radiated from the device under test 1.

In addition, in a state in which there are such multiple reflections, an input impedance of a transmitting antenna of the device under test 1 greatly differs from an input impedance in free space due to coupling to the closed space 11 of the elliptical mirror 10.

A method for measuring a radiation power according to a second embodiment of the present invention will now be described in which, even when there are multiple reflections such as those described above, total radiation power of a radio wave radiated from the device under test 1 can be measured accurately.

Figure 17:
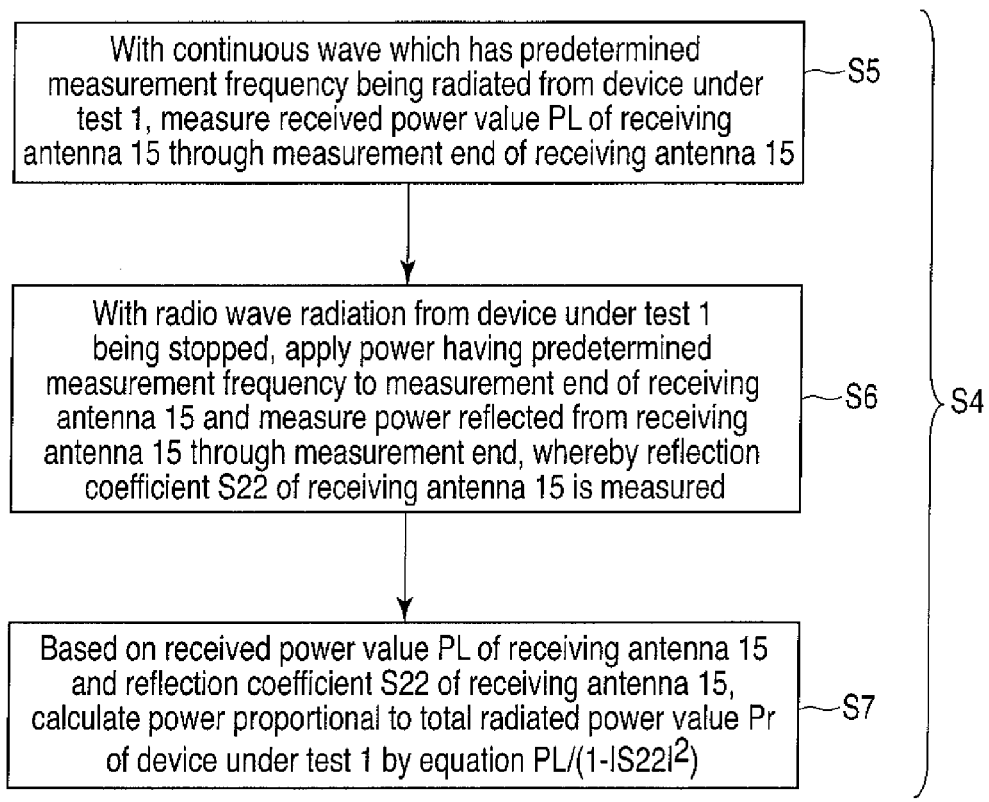
FIG. 17 is a flowchart of a main part illustrated to describe a method for measuring a radiation power according to the second embodiment of the present invention.

The method for measuring a radiation power according to the second embodiment of the present invention is configured such that step S4 in the aforementioned first embodiment where the total radiation power is measured at the measurement end of the receiving antenna 15 includes steps S5, S6, and S7 such as those illustrated in FIG. 17.

Specifically, when the total radiation power is measured at the measurement end of the receiving antenna 15, as illustrated in FIG. 17, first, with a continuous wave which has a predetermined measurement frequency being radiated from the device under test 1, a received power value PL of the receiving antenna 15 is measured through the measurement end of the receiving antenna 15 (step S5).

Then, with the radio wave radiation from the device under test 1 being stopped, power having the predetermined measurement frequency is applied to the measurement end of the receiving antenna 15 and power reflected from the receiving antenna 15 is measured through the measurement end, whereby a reflection coefficient value S22 of the receiving antenna 15 is measured (step S6).

Subsequently, based on the value of received power PL which is measured at step S5 where the value PL of received power of the receiving antenna 15 is measured, and the reflection coefficient value S22 which is measured at step S6 where the reflection coefficient value S22 of the receiving antenna 15 is measured, power proportional to a total radiation power value Pr of the device under test 1 is calculated by the following equation (step S7):

$$PL/(1-|S22|^2).$$

A measurement principle of the method for measuring a radiation power according to the second embodiment of the present invention will now be described in which only by thus measuring a reflection coefficient value S22 of the receiving antenna 15 and a value of received power PL of the receiving antenna, total radiation power from the device under test 1 can be calculated.

Figure 18:
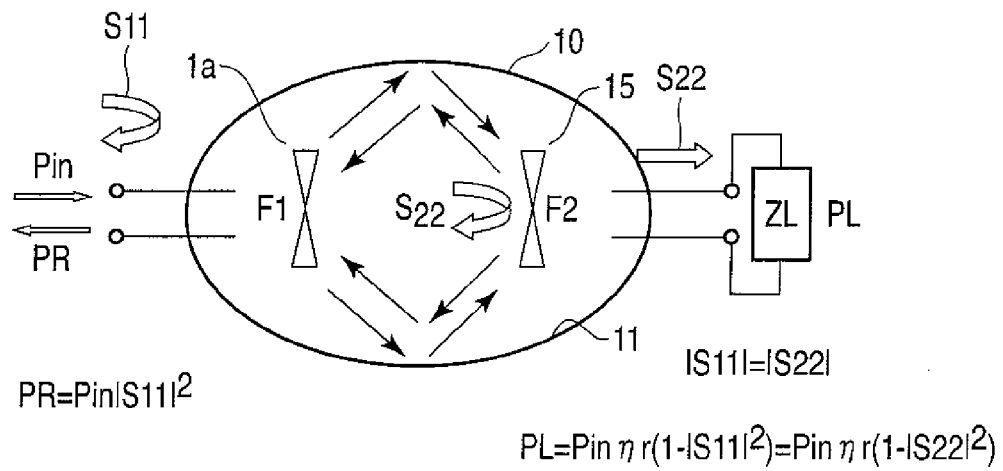
FIG. 18 is a relationship diagram between a reflection coefficient S11 of a transmitting antenna and a reflection coefficient S22 of a receiving antenna in an elliptical mirror in a steady state, which is illustrated to describe a principle of the method for measuring a radiation power according to the second embodiment of the present invention.

First, the fact that, as illustrated in FIG. 18, a reflection coefficient S11 of a transmitting antenna 1a which is put instead of the device under test 1 in the elliptical mirror 10 coincides with a reflection coefficient S22 of the receiving antenna 15 will be described.

In the elliptical mirror 10, as described above, when a radio wave that is radiated from the transmitting antenna 1a at the focal point F1 and reflected once at the wall surface 11 and reaches the receiving antenna 15 is a primary wave, there are multiple reflections where a secondary wave being a radio wave which is scattered by the receiving antenna 15 having received the primary wave and is reflected again at the wall surface 11 and returns to the focal point F1 and is further reflected at the wall surface 11 and inputted to the receiving antenna 15 at the focal point F2, or higher-order radio waves are inputted to the receiving antenna 15.

As used herein, the term "multiple reflection" refers to a concept for when a phenomenon is observed in the time domain. In a steady state in which multiple reflections are repeated multiple times, there are no back and forth reflections and there is only steady radio wave energy that propagates forward or backward.

The reflection coefficient S22 of the receiving side is normally defined as seeing the receiving antenna 15 from the side of a load ZL. Conversely, when the side of the load ZL is seen from an antenna terminal of the receiving antenna 15, the magnitude of a reflection coefficient is the same and a phase is inverted.

As illustrated in FIG. 18, a wave reflected as seen from the receiving antenna 15 just propagates through the elliptical mirror 10 and returns to the side of the transmitting antenna 1a.

Then, power PR that returns to the side of the transmitting antenna 1a is represented by:

$$PR=Pin|S11|^2$$

when an output from a transmitter that is applied to an input terminal of the transmitting antenna 1a is Pin.

In a steady state, the wave returning to the side of the transmitting antenna 1a is supposed to be a reflected wave at the input terminal of the transmitting antenna 1a.

Namely, in such a steady state in the elliptical mirror 10, when the reflection coefficient of the transmitting antenna 1a is S11, $$|S11|=|S22|$$

holds between the reflection coefficient S11 of the transmitting antenna 1a and the reflection coefficient S22 of the receiving side.

Therefore, power PL to be extracted by the load of the receiving antenna 15 is represented by:

$$PL=Pin\eta r(1-|S11|^2)=Pin\eta r(1-|S22|^2).$$

The power PL extracted by the load of the receiving antenna 15 can be precisely measured in principle, using a spectrum analyzer, a power meter, etc.

In the equation, Pin is an output from the transmitter which is applied to the input terminal of the transmitting antenna 1a and $\eta r$ is the radiation efficiency of the transmitting antenna 1a and the product of Pin and $\eta r$ represents maximum radiation power Pr from a radio (device under test 1).

In general, sufficient matching is obtained between the transmitting antenna 1a and the transmitter and thus the maximum radiation power Pr coincides with the radiation power Pr from the radio.

This is a very important fact. Since the reflection coefficient S22 of the receiving side can be precisely measured in principle, using a network analyzer, etc., the radiation power Pr from the radio can be represented from the reflection coefficient S22 and the received power PL of the receiving side by:

$$Pr = Pin\eta r = PL/(1-|S22|^2) \qquad (1).$$

That is, provided that the reflection coefficient S22 and the received power PL of the receiving side can be measured precisely, a value proportional to the radiation power Pr from the radio (device under test 1) can be found independent of the reflection coefficient S11 of the transmitting antenna 1a.

This is the measurement principle of the method for measuring a radiation power according to the second embodiment of the present invention.

Figure 19:
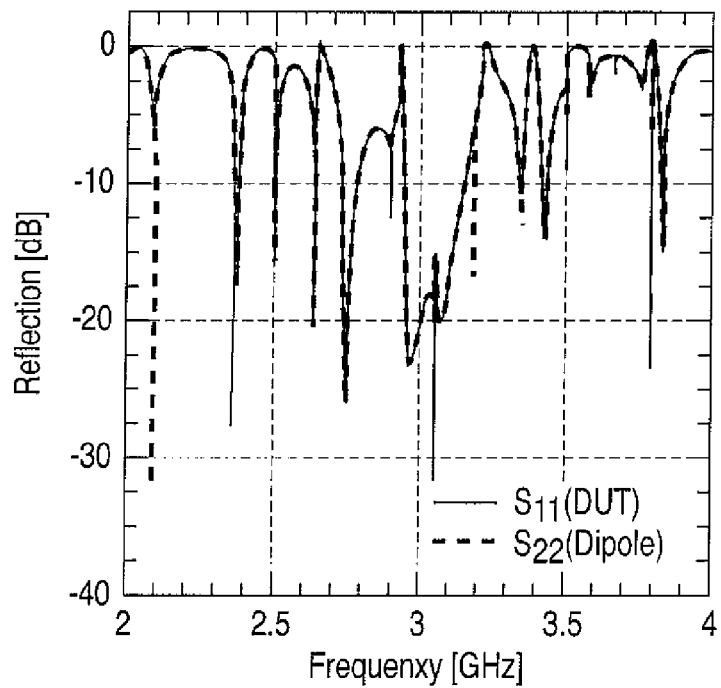
FIG. 19 is a diagram illustrating simulation results to demonstrate the principle of the method for measuring a radiation power according to the second embodiment of the present invention.

FIG. 19 is a diagram illustrating simulation results to demonstrate that the measurement principle of the method for measuring a radiation power according to the second embodiment of the present invention is right.

Specifically, as illustrated in FIG. 18, in the closed space 12 of the elliptical sphere 10, a device under test 1 (DUT) instead of a transmitting antenna 1a, and a receiving antenna 15 (here, a dipole antenna) are disposed so as to respectively coincide with the positions of one focal point F1 and the other focal point F2, and a simulation is performed. As a result, as illustrated in FIG. 19, the characteristics of a reflection coefficient S11 of the device under test 1 (DUT) and a reflection coefficient S22 of the receiving antenna 15 (here, a dipole antenna) match each other, which demonstrates that |S11|=|S22| holds.

This indicates that the invention of the method for measuring a radiation power according to the second embodiment of the present invention holds true by the demonstration that |S11|=|S22| holds when the device under test 1 (DUT) and the receiving antenna 15 (here, a dipole antenna) are respectively disposed in positions that substantially coincide with the two focal points F1 and F2 in the closed space 12 of the elliptical sphere 10.

The aforementioned equation (1) is also represented as:

$$Pr = K \cdot PL/(1-|S22|^2) \qquad (2).$$

In the equation, K is the constant of a measurement system including a loss factor of the elliptical mirror 10, a loss in a cable connecting between the receiving antenna 15 and a receiver, etc., and the constant K can be eliminated by comparing with a standard system, as will be described later.

When the loss in the cable connecting between the receiving antenna 15 and the receiver is Lc, the loss in the receiving antenna 15 is η, and the loss factor of the elliptical mirror 10 is Lr, the constant K is represented by:

$$K = Lc \cdot \eta \cdot Lr.$$

Therefore, a value of the constant K can be found in advance.

Also, by finding a constant K corresponding to the aforementioned loss AP and dividing equation (1) by the constant K, accurate total radiation power Pr where losses in the measurement system including a loss in the cable, etc., are corrected can be calculated.

For technologies to solve the aforementioned multiple reflection problem, by separating and extracting only a primary wave by using, as will be described later, a method in which a radio wave absorber is provided in the closed space 11 of the elliptical mirror 10 or a temporally cutting method which is performed for a short-pulse burst signal, or the like, total radiation power of the device under test 1 can be measured accurately.

That is, when only a primary wave is thus separated and extracted, a characteristic is obtained that is extremely close to that of the device under test 1 for when it is put in free space.

Therefore, when a radio wave radiated from the device under test 1 is a narrow-band signal, higher-order reflected waves of secondary or higher order waves are made negligible by placing a radio wave absorber inside the closed space 11 of the elliptical mirror 10 or using a receiving antenna with small scattering as the receiving antenna 15, and in addition a method of comparison, which will be described later, is used from a primary wave, whereby total reflected power of a radio wave radiated from the device under test 1 can be measured accurately.

Figure 3:
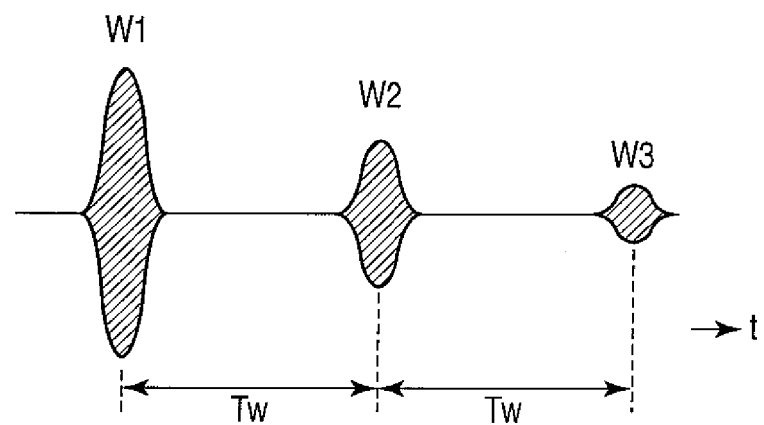
FIG. 3 is a waveform diagram illustrated to describe an example of a received signal of the receiving antenna (15) used in the method for measuring a radiation power and the apparatus for measuring a radiation power according to the first and second embodiments of the present invention.

Even when higher-order reflected waves are not negligible, if a radio wave radiated from the device under test 1 is a short pulse, since time waveforms of a signal S to be obtained are, as illustrated in FIG. 3, outputted at predetermined intervals, i.e., a primary wave W1, a secondary wave W2, a tertiary wave, . . . , a signal portion with the highest level is extracted as a primary wave and power thereof can be found.

However, since the frequencies of radio waves radiated from the device under test 1 are as high as several GHz to several tens of GHz, even when time waveforms thereof are directly observed with an oscilloscope, etc., it is difficult to extract a primary wave signal.

In view of this, for example, as will be described later, a spectrum of an output signal S from the receiving antenna 15 is obtained, the spectrum is subjected to an inverse Fourier transform process to obtain time waveform data, a primary wave component is extracted from the time waveform data, a Fourier transform is performed to bring the data back to frequency domain data again, and the frequency domain data is integrated to find total radiation power.

First Modification of the Second Embodiment

FIG. 20 is a flowchart illustrated to describe a first modification of the method for measuring a radiation power according to the second embodiment of the present invention.

Specifically, in the first modification, first, a predetermined measurement frequency to measure a reflection coefficient S22 of the receiving antenna 15 and a received power value PL of the receiving antenna is set in advance (step S11).

Then, with radio wave radiation from the device under test 1 being stopped, a reflection coefficient S22 of the receiving antenna 15 is measured (step S12).

In this case, when it is obvious that transmission of the device under test 1 is being stopped, there is no need to bring the device under test 1 into a state in which radio wave radiation from the device under test 1 is being stopped.

In this step S12, to measure a reflection coefficient value S22 of the receiving antenna 15, a radio wave having a predetermined frequency and power to be measured is applied in advance to a measurement end of the receiving antenna 15 and power reflected from the receiving antenna 15 is measured through the measurement end and then a reflection coefficient 522 of the receiving antenna 15 is measured.

Subsequently, radio wave radiation of a continuous wave from the device under test 1 starts (step S13).

Then, a received power value PL of the receiving antenna 15 is measured through the measurement end of the receiving antenna 15 (step S14).

Then, power proportional to a total radiation power value Pr of the device under test 1 is calculated based on $PL/1-|S22|^2$ in equation (1) (step S15).

A reflection coefficient value S22 of the receiving antenna 15 may be measured and stored in advance before start or step S11 and may be used when a total radiation power value Pr of the device under test 1 is calculated at step S15.

Second Modification of the Second Embodiment

FIG. 21 is a flowchart illustrated to describe a second modification of the method for measuring a radiation power according to the second embodiment of the present invention.

Specifically, in the second modification, first, a predetermined measurement frequency to measure a reflection coefficient S22 of the receiving antenna 15 and a received power value PL of the receiving antenna is set in advance (step S31).

Then, radio wave radiation of a continuous wave from the device under test 1 starts (step S32).

Subsequently, a received power value PL of the receiving antenna 15 is measured through a measurement end of the receiving antenna 15 (step S33).

Then, with the radio wave radiation from the device under test 1 being stopped, a reflection coefficient S22 of the receiving antenna 15 is measured (step S34).

In this case, when it is obvious that transmission of the device under test 1 is being stopped, there is no need to bring the device under test 1 into a state in which the radio wave radiation from the device under test 1 is being stopped.

In this step S34, to measure a reflection coefficient value S22 of the receiving antenna 15, a radio wave having a predetermined frequency and power to be measured is applied in advance to the measurement end of the receiving antenna 15 and power reflected from the receiving antenna 15 is measured through the measurement end and then a reflection coefficient S22 of the receiving antenna 15 is measured.

Then, power proportional to a total radiation power value Pr of the device under test 1 is calculated based on $PL/1-|S22|^2$ in equation (1) (step S35).

A reflection coefficient value S22 of the receiving antenna 15 may be measured and stored in advance before start or step S31 and may be used when a total radiation power value Pr of the device under test 1 is calculated at step S35.

Third Embodiment

Figure 22:
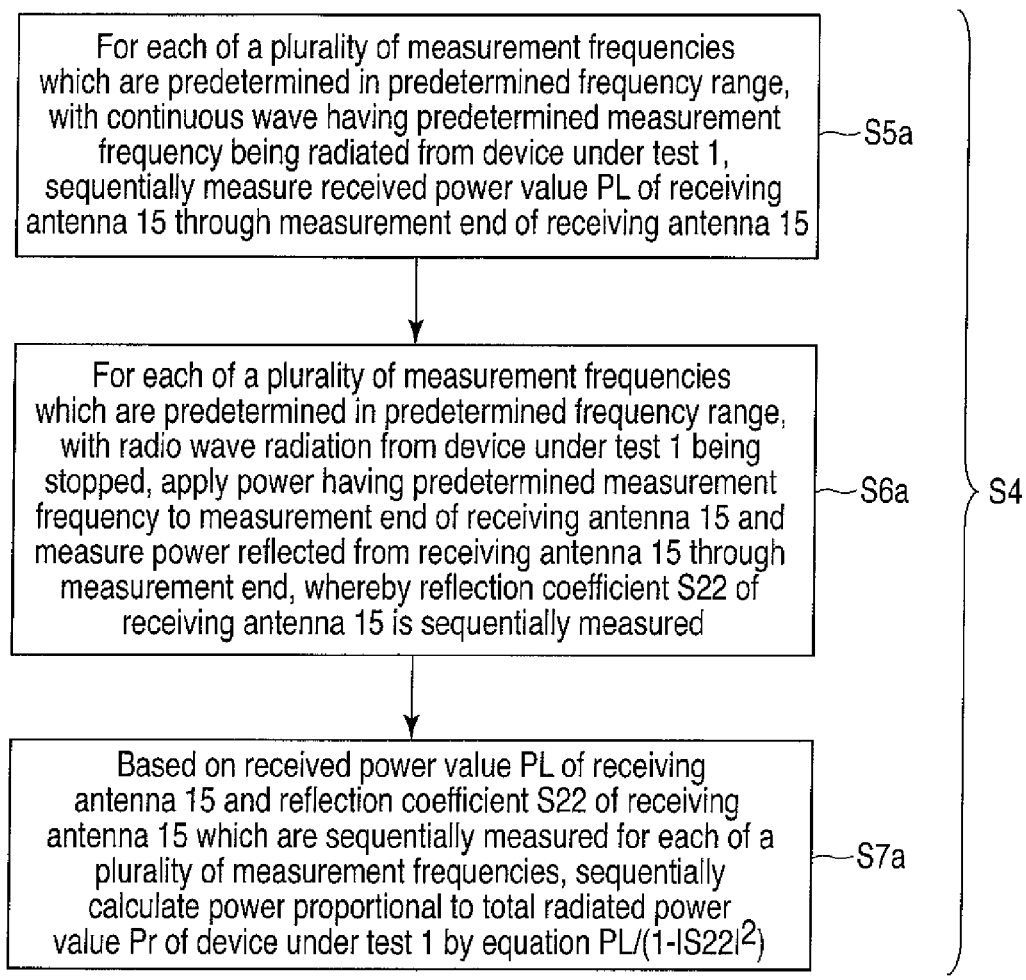
FIG. 22 is a flowchart of a main part illustrated to describe a method for measuring a radiation power according to a third embodiment of the present invention.

A method for measuring a radiation power according to a third embodiment of the present invention is configured such that step S4 in the aforementioned first embodiment where the total radiation power is measured at the measurement end of the receiving antenna 15 includes steps S5a, S6a, and S7a such as those illustrated in FIG. 22.

Specifically, when the total radiation power is measured at the measurement end of the receiving antenna 15, as illustrated in FIG. 22, first, for each of a plurality of measurement frequencies which are predetermined in a predetermined frequency range, with a continuous wave which has the predetermined measurement frequency being radiated from the device under test 1, received power PL of the receiving antenna 15 is sequentially measured through the measurement end of the receiving antenna 15 (step S5a).

Then, with the radio wave radiation from the device under test 1 being stopped, for each of the plurality of measurement frequencies which are predetermined in the predetermined frequency range, power having the predetermined measurement frequency is applied to the measurement end of the receiving antenna 15 and power reflected from the receiving antenna 15 is sequentially measured through the measurement end, whereby a reflection coefficient value S22 of the receiving antenna 15 is sequentially measured (step S6a).

The order of step S5a and step S6a is not limited to the case in which, as illustrated in FIG. 22, step S5a is performed followed by step S6a, and may be reversed order.

Subsequently, based on the received power PL which is sequentially measured for each of the plurality of measurement frequencies at step S5a and the reflection coefficient value S22 which is sequentially measured for each of the plurality of measurement frequencies at step S6a, power proportional to a total radiation power value Pr for each of the plurality of measurement frequencies is sequentially calculated by the following equation (step S7a):

$$PL/(1-|S22|^2).$$

That is, in the method for measuring a radiation power according to the third embodiment of the present invention, a measurement frequency is set to a center frequency of radio waves of a relatively narrow band such as IS-95 which is a standard for mobile phones, for example, used as the device under test 1, and a reflection coefficient value S22 and received power PL of the receiving antenna 15 are measured.

In this case, a frequency range specifies those frequencies up to that including spurious to be measured, and intervals between a plurality of frequencies are, for example, intervals of 900 kHz and 1980 kHz from a center frequency.

The intervals between a plurality of frequencies are merely an exemplification and thus may be set as frequency intervals which are defined in a standard such as that described above, or may be, as necessary, narrow frequency intervals or unequal frequency intervals or equal frequency intervals to, for example, improve measurement accuracy at multiple measurement frequencies.

When, at step S5a and step S6a, received power PL and a reflection coefficient value S22 are measured for each of a plurality of measurement frequencies, the order of the measurement frequencies may be such that measurement is performed from a lower measurement frequency to a higher measurement frequency or may be the other way around, or may be any order regardless of the level of the measurement frequencies.

Subsequently, using the aforementioned equation (1), from the reflection coefficient value S22 and the received power PL for each of the measurement frequencies, power proportional to a total radiation power value Pr for each of the plurality of measurement frequencies is sequentially calculated.

Figure 23:
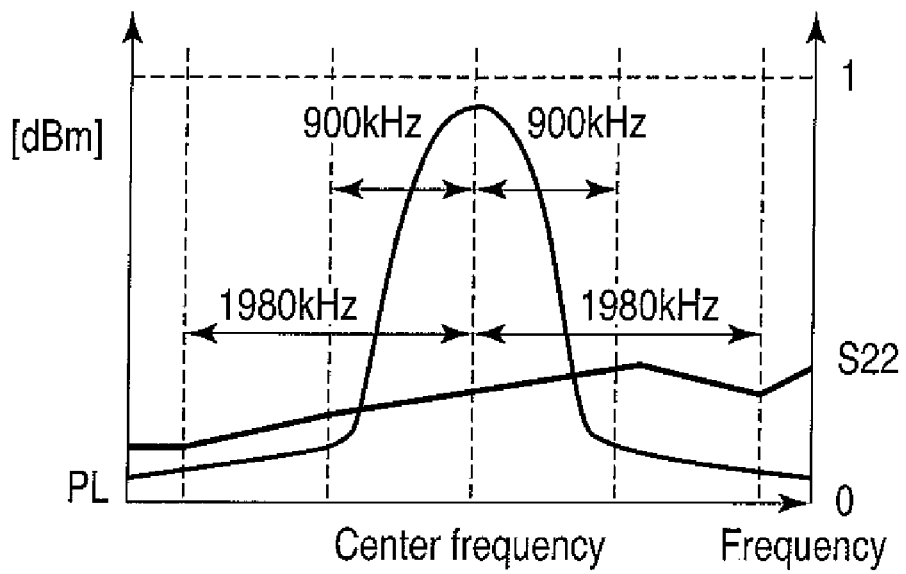
FIG. 23 is a spectrum waveform diagram illustrated to describe the method for measuring a radiation power according to the third embodiment of the present invention.
Figure 24:
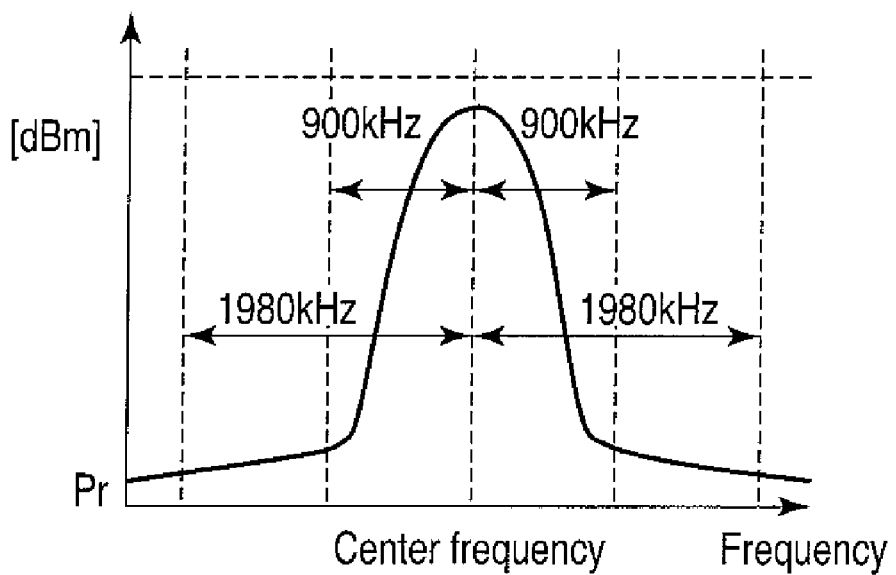
FIG. 24 is a spectrum waveform diagram illustrated to describe the method for measuring a radiation power according to the third embodiment of the present invention.

In such a method for measuring a radiation power according to the third embodiment of the present invention, processes of the above-described measurement and calculation are performed, for example, using a spectrum analyzer, based on spectrum displays such as those illustrated in FIGS. 23 and 24.

FIG. 23 illustrates results of measurement of a reflection coefficient value S22 and received power PL at measurement frequencies which are set in the above-described manner.

FIG. 24 illustrates results of calculation of a total radiation power value Pr from reflection coefficient values S22 and received powers PL at the measurement frequencies which are set in the above-described manner.

However, instead of performing the processes based on spectrum displays, the processes may be performed using a table including measurement frequencies, measurement values of reflection coefficient values S22, measurement values of received powers PL, and total radiation powers Pr.

Fourth Embodiment

Figure 25:
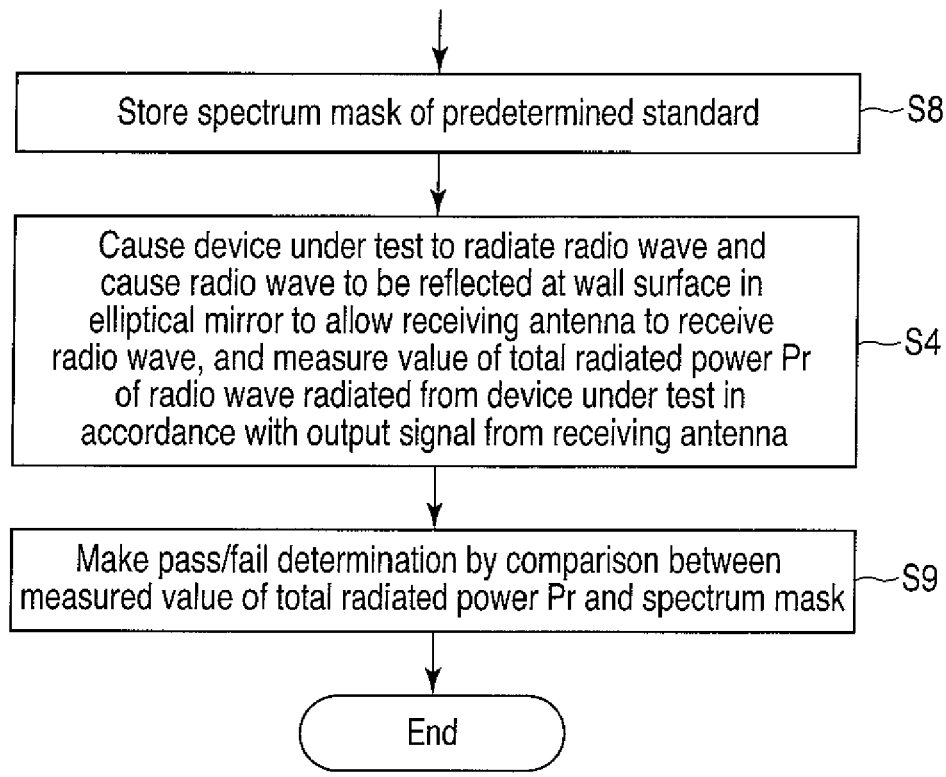
FIG. 25 is a flowchart of a main part illustrated to describe a method for measuring a radiation power according to a fourth embodiment of the present invention.

A method for measuring a radiation power according to a fourth embodiment of the present invention is configured to further include steps S8 and S9 such as those illustrated in FIG. 25 before and after step S4 in the aforementioned first embodiment where the total radiation power is measured at the measurement end of the receiving antenna 15.

Specifically, as illustrated in FIG. 25, at step S8 which is performed before measuring the total radiation power at the measurement end of the receiving antenna 15 at step S4, a spectrum mask of a predetermined standard which includes predetermined frequencies and predetermined output intensities is stored in advance for radio waves radiated from the device under test 1.

Then, at step S9 which is performed after calculating, at step S4, power proportional to a total radiation power value Pr of the device under test (1), a pass/fail determination as to whether the power proportional to the total radiation power value Pr which is calculated at the above-described step S4 satisfies the predetermined standard is made by a comparison with the spectrum mask stored at the above-described step S8.

Step S8 where a spectrum mask of a predetermined standard is stored is not limited to immediately before step S4, as illustrated in FIG. 25, and just needs to be before step S4. For example, before start, a spectrum mask of a predetermined standard which includes predetermined frequencies and predetermined output intensities may be stored in advance for radio waves radiated from the device under test 1.

That is, in the method for measuring a radiation power according to the fourth embodiment of the present invention, a spectrum mask of IS-95 which is a standard for mobile phones, for example, used as the device under test 1 is stored and a comparison between the spectrum mask and total radiation power values Pr for a plurality of frequencies is performed to make a pass/fail determination as to whether the total radiation power values Pr satisfy the standard.

When results of the determination indicate that the total radiation power values Pr for the plurality of frequencies satisfy the standard, the display "Pass", for example, is provided on a screen of a display (not illustrated) used in an apparatus for measuring a radiation power.

When results of the determination indicate that the standard is not satisfied, the display "Fail", for example, may be provided on a screen of a display (not illustrated) used in an apparatus for measuring a radiation power, and a frequency at which the standard is not satisfied and a value of total radiation power Pr for the frequency may be further displayed.

Furthermore, for the total radiation power Pr that does not satisfy the standard, a difference value from the standard value may be displayed on a screen of a display (not illustrated) used in an apparatus for measuring a radiation power.

The configuration may be such that these determination results can be outputted to a computer, etc., provided external to the apparatus for measuring a radiation power.

Figure 26:
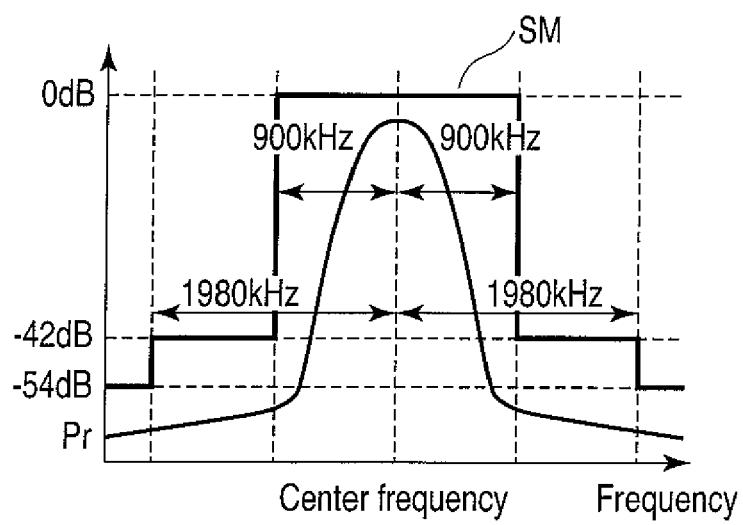
FIG. 26 is a spectrum mask and a spectrum waveform diagram illustrated to describe the method for measuring a radiation power according to the fourth embodiment of the present invention.

In such a method for measuring a radiation power according to the fourth embodiment of the present invention, processes of the above-described measurement and calculation are performed, for example, using a spectrum analyzer, based on spectrum display such as that illustrated in FIG. 26.

FIG. 26 illustrates results of a comparison of values of total radiation power Pr with a spectrum mask SM for set measurement frequencies.

Thus, instead of this, the processes may be performed using a table including measurement frequencies, total radiation powers Pr, and power values corresponding to a spectrum mask.

FIG. 27 illustrates a spectrum mask to be applied to UWB.

UWB enables high-speed data communication in a short range by transmitting a pulse-like signal with an extremely short time in a very wide band over several hundred MHz to several GHz.

However, since in UWB interference is expected at a portion of the band that overlaps a band for other communications, it is mandatory to incorporate DAA (Detect and Avoid) with other communication schemes. In order to satisfy this requirement, a spectrum mask such as that illustrated in FIG. 27 is defined.

UWB devices are required to have characteristics that satisfy a spectrum mask such as that illustrated in FIG. 27. In the method for measuring a radiation power according to the fourth embodiment of the present invention, a pass/fail determination as to whether such a spectrum mask is satisfied can be made simply and in a short time.

Fifth Embodiment

Figure 28:
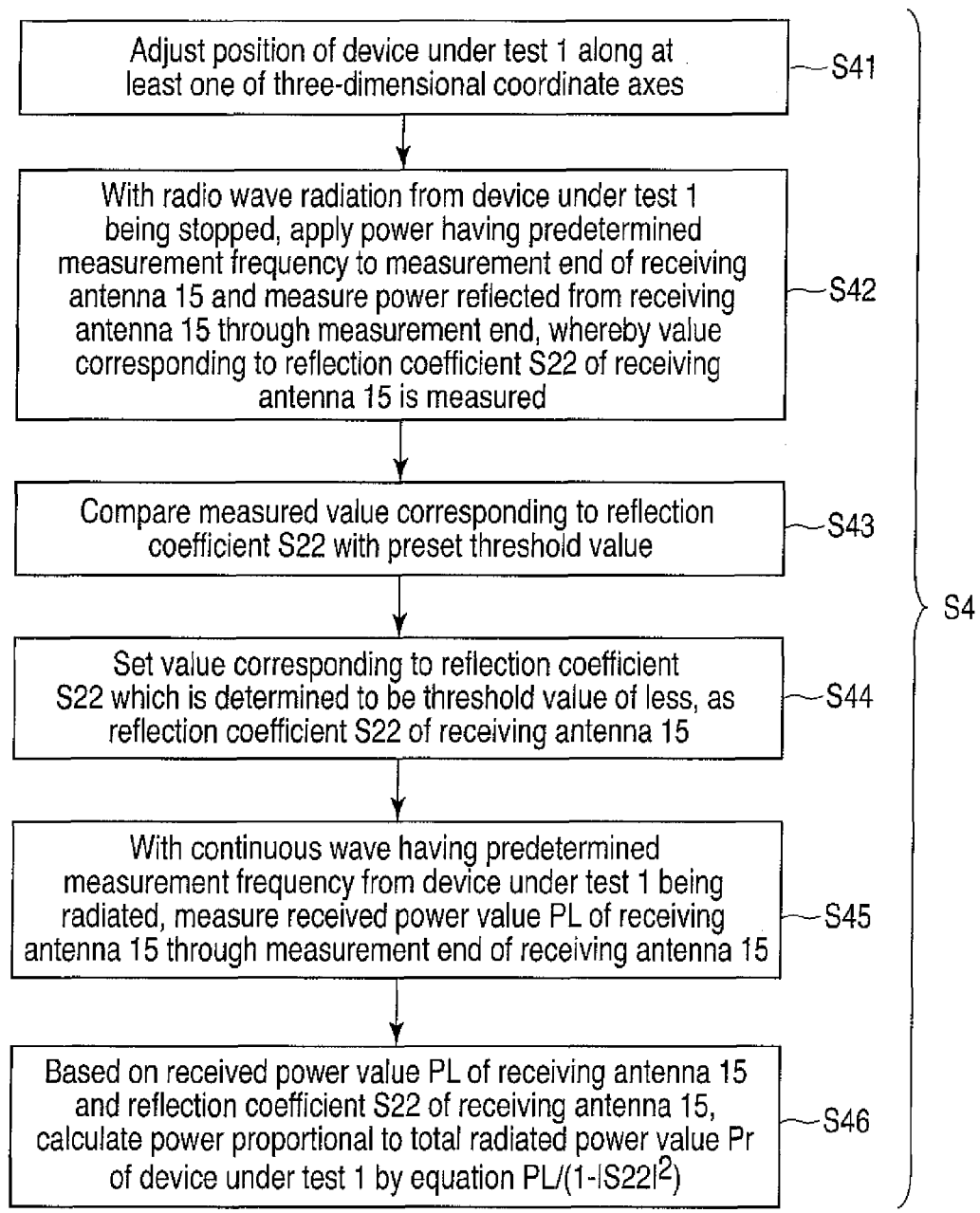
FIG. 28 is a flowchart of a main part illustrated to describe a method for measuring a radiation power according to a fifth embodiment of the present invention.

A method for measuring a radiation power according to a fifth embodiment of the present invention is configured such that step S4 in the aforementioned first embodiment where the total radiation power is measured at the measurement end of the receiving antenna 15 further includes steps S41, S42, S43, S44, S45, and S46 such as those illustrated in FIG. 28, instead of steps S5, S6 and S7 in the above-described second embodiment.

Specifically, when the total radiation power is measured at the measurement end of the receiving antenna 15, as illustrated in FIG. 28, first, the position of the device under test 1 is adjusted along at least one of three-dimensional coordinate axes which intersect one another (step S41).

Then, each time the position of the device under test 1 is adjusted at the above-described step S41, with radio wave radiation from the device under test 1 being stopped, power having a predetermined measurement frequency is applied to the measurement end of the receiving antenna 15 and power reflected from the receiving antenna 15 is measured through the measurement end, whereby a value corresponding to a reflection coefficient value S22 of the receiving antenna 15 is measured (step S42).

Then, the value corresponding to the reflection coefficient value S22 of the receiving antenna 15 which is measured at the above-described step S42 is compared with a preset threshold value (step S43).

Then, a value corresponding to the reflection coefficient value S22 which is measured at the above-described step S42 and which is determined by a comparison at step S43 to be the threshold value or less is set as the reflection coefficient value S22 of the receiving antenna 15 (step S44).

Subsequently, with a continuous wave which has the predetermined measurement frequency being radiated from the device under test 1, a received power value PL of the receiving antenna 15 is measured through the measurement end of the receiving antenna 15 (step S45).

Then, based on the received power value PL of the receiving antenna 15 which is measured at the above-described step S45 and the value corresponding to the reflection coefficient value S22 which is set as the reflection coefficient value S22 of the receiving antenna 15 at the above-described step S44, calculation of power proportional to a total radiation power value Pr of the device under test (1) starts by the following equation (step S46):

$$PL/(1-|S22|^2).$$

The reason why an adjustment to the position of the device under test 1 is required in such a method for measuring a radiation power according to the fifth embodiment of the present invention will now be described.

In general, the device under test 1 itself is designed to obtain favorable matching of the device under test 1 alone in order to effectively radiate power generated therefrom into space. Accordingly, a reflection coefficient value S11 of the device under test 1 itself also has a favorable value.

The case in which the device under test 1 is disposed in the closed space 12 of the elliptical sphere 10 will now be discussed.

As previously described, since |S11|=|S22| holds in the closed space 12 of the elliptical sphere 10, the reflection coefficient value S22 of the receiving antenna is equal to the reflection coefficient value S11 of the device under test itself.

That is, by placing the device under test 1 and the receiving antenna 15 such that they substantially coincide with the positions of one focal point F1 and the other focal point F2, respectively, in the closed space 12 of the elliptical sphere 10, the reflection coefficient value S22 of the receiving antenna 15 is also a favorable value that does not affect the calculation of a total radiation power value.

However, in the actual conditions of measurement where the device under test 1 is of a wide variety, different models of the device under test 1 have different unique antenna positions. Thus, a radio wave radiation pattern from the device under test 1 including an influence by a casing of the device under test 1 and the center of radiation of radio waves therefrom also vary from model to model.

Therefore, in general, just because the device under test 1 is disposed to substantially coincide with the position of one focal point F1 in the closed space 12 of the elliptical sphere 10, only by an external appearance of the device under test 1, does not mean the center of radiation of radio waves from the device under test 1 substantially coincides with the position of one focal point F1 in the closed space 12 of the elliptical sphere 10.

When the device under test 1 is of an antenna built-in type, the antenna position cannot be determined by an external appearance thereof. Furthermore, in many cases, which part of the device under test 1 is the center of radiation of radio waves is totally unidentifiable from the external appearance.

Namely, it is difficult to place the device under test 1 such that the center of radiation of radio waves therefrom substantially coincides with the position of one focal point F1 in the closed space 12 of the elliptical sphere 10, from the external appearance of the device under test 1.

In the closed space 12 of the elliptical sphere 10, when, as described above, the center of radiation of radio waves from the device under test 1 does not substantially coincides with the position of one focal point F1 in the closed space 12 of the elliptical sphere 10, a reflection coefficient value S11 of the device under test 1 itself and an associated reflection coefficient value S22 of the receiving antenna 15 may degrade, which may result in a position that affects the calculation of a total radiation power value Pr.

When a reflection coefficient value S11 of the device under test 1 itself and an associated reflection coefficient value S22 of the receiving antenna 15 degrade, reflected power increases.

The reflection coefficient value S22 of the receiving antenna 15 normally takes a value between 0 and 1 and 0 indicates no reflection and 1 indicates full reflection.

Since the degradation in the reflection coefficient value S22 of the receiving antenna 15 causes S22 to approach 1, the denominator $(1-|S22|^2)$ of equation (1) for finding a total radiation power value Pr approaches zero and also mismatching loss increases. Accordingly, a received power value PL of the receiving antenna 15 which serves as the numerator of equation (1) for finding a total radiation power value Pr also decreases and approaches zero.

That is, an indeterminate operation that approximates Pr=0/0 results and thus calculation of a total radiation power value Pr cannot be accurately performed.

To solve such a problem, an adjustment to the position of the device under test 1 needs to be made to obtain a favorable reflection coefficient value S22 of the receiving antenna 15.

Namely, by making an adjustment to the position of the device under test 1 to obtain a favorable reflection coefficient value S22 of the receiving antenna 15, calculation of a total radiation power value Pr can be performed with a high degree of accuracy.

(First Exemplary Operation (Manual) of an Adjustment to the Position of the Device Under Test 1)

For a means for adjusting the position of the device under test 1, for example, as illustrated in FIG. 7 of the aforementioned Patent Document 2, a mechanism is used that can allow to manually adjust the position of the device under test 1 along at least one of XYZ axis lines.

An exemplary operation for when this mechanism is used as an example of the means for adjusting the position of the device under test 1 will be described below.

Using a position adjustment mechanism such as that illustrated in FIG. 7 of the aforementioned Patent Document 2, as an example of the means for adjusting the position of the device under test 1, the position of the device under test is manually adjusted to a predetermined position along at least one of XYZ axis lines. Every time the adjustment is made, a reflection coefficient value S22 of the receiving antenna 15 is measured to find a position of the device under test 1 in which a favorable reflection coefficient value S22 of the receiving antenna 15 is obtained.

For a criterion of determination of a value corresponding to the reflection coefficient value S22 of the receiving antenna 18, a value that does not affect the calculation of a total radiation power value, e.g., 10 dB in return loss conversion, is determined in advance as a threshold value to be set in advance.

When the position of the device under test 1 is manually adjusted to a predetermined position and a return loss serving as the preset threshold value is better than 10 dB, it is determined that the position of the device under test 1 is favorable at that position. Then, measurement of total radiation power by equation (1) starts.

Of course, in this case, using the reflection coefficient value S22 of the receiving antenna 15 as it is, a position of the device under test 1 may be found such that S22 approaches zero. For example, when the reflection coefficient value S22 of the receiving antenna 15 reaches 0.316, it may be determined that the position of the device under test 1 is favorable.

Conversion to a VSWR (Voltage Standing Wave Ratio) corresponding to the reflection coefficient value S22 of the receiving antenna 15 may be performed and a position of the device under test 1 may also be found so as to approach 1.0 which indicates no reflection. When the VSWR reaches 1.92, it may also be determined that the position of the device under test 1 is favorable.

The methods are not limited to those described above. A traveling wave voltage and a reflected wave voltage, traveling wave power and reflected wave power, an impedance ratio, etc., which are values corresponding to a reflection coefficient may be used and when they reach favorable values, it may be determined that the position of the device under test 1 is favorable.

Furthermore, since S-parameter used for the reflection coefficient value S22 of the receiving antenna 15 can be converted to other parameters, e.g., Z-parameter, and vice versa, a criterion of determination that the position of the device under test 1 is favorable is not limited to S-parameter.

The means for adjusting the position of the device under test 1 is not limited to a mechanism such as that illustrated in FIG. 7 of the aforementioned Patent Document 2 and can be any as long as the mechanism allows to manually adjust the position of the device under test 1 along at least one of XYZ axis lines.

In order that when, in a predetermined model of the device under test 1, after a position in which the position of the device under test 1 is favorable is found, a test is conducted on the predetermined model again, measurement can be performed at the position, there may be, as illustrated in FIG. 7 of the aforementioned Patent Document 2, a placement portion and an alphabetical letter or identifiable mark associated with the model in a hole associated therewith.

In this case, in FIG. 7 of the aforementioned Patent Document 2, since it is known that a position in which the position of the device under test 1 is favorable is a position indicated by a predetermined alphabetical letter, the device under test 1 can be easily re-set in a position in which the position of the device under test is favorable, by using, as a guide, a letter on a reference plane that is peeped through the hole of the placement portion.

(Second Exemplary Operation (Automatic) of an Adjustment to the Position of the Device Under Test 1)

A mechanism serving as a means for adjusting the position of the device under test 1 which is used in the above-described first exemplary operation of an adjustment to the position of the device under test 1 may further include a mechanism that is driven along at least one of XYZ axis lines and an adjustment to the position of the device under test 1 may be automatically made using a control means.

Figure 29:
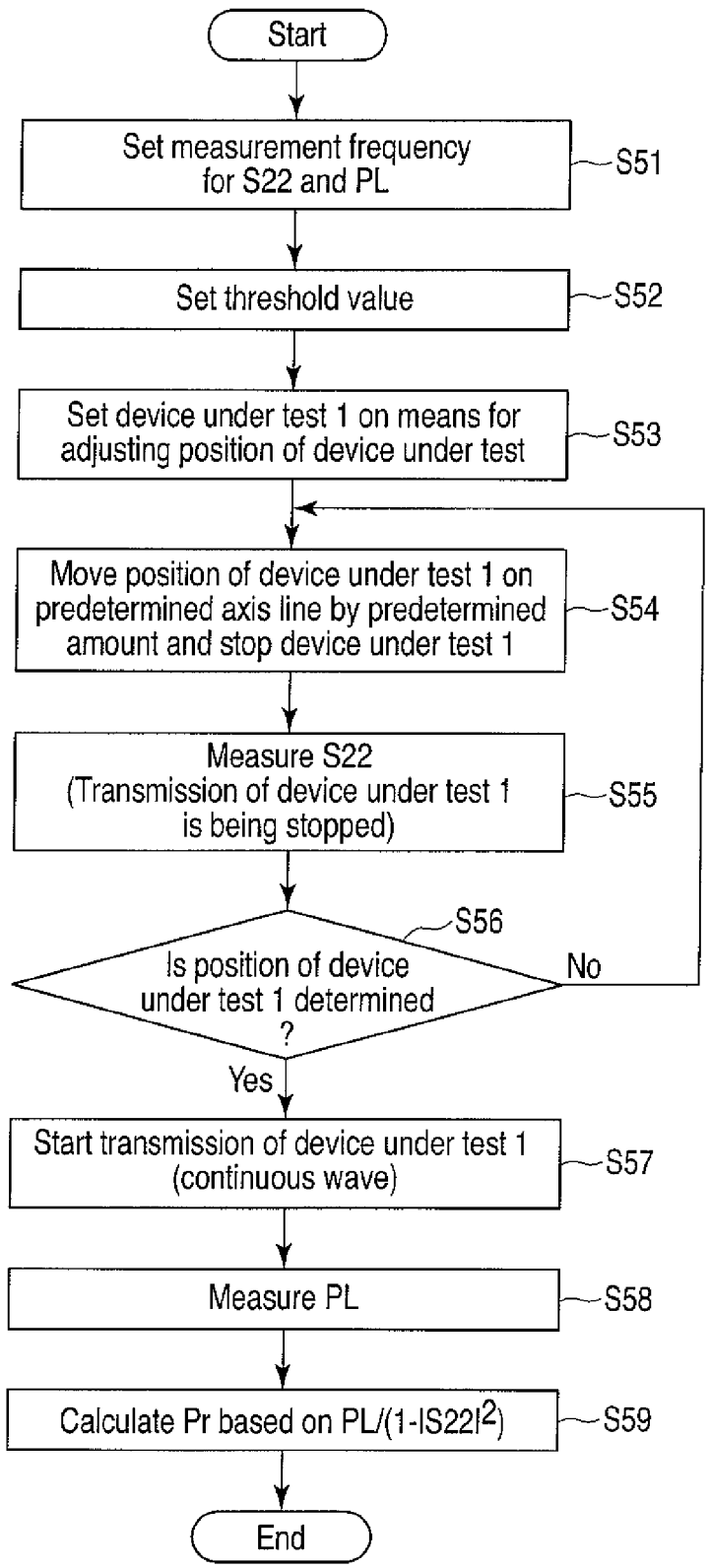
FIG. 29 is a flowchart of a main part illustrated to describe a specific example of the method for measuring a radiation power according to the fifth embodiment of the present invention.

For example, as illustrated in a flowchart illustrated in FIG. 29, after the position of the device under test is moved on a predetermined axis line by a predetermined amount and stopped, every time the movement is performed, a reflection coefficient value S22 of the receiving antenna is measured to find a position of the device under test 1 in which a favorable reflection coefficient value S22 of the receiving antenna 15 is obtained.

When a favorable reflection coefficient value S22 of the receiving antenna 15 is obtained, measurement of a total radiation power value Pr of the device under test 1 starts.

Specifically, in the flowchart illustrated in FIG. 29, first, a desired frequency to be measured is set in advance (step S51).

Then, a threshold value (e.g., a return loss of 10 dB as a value corresponding to the reflection coefficient value S22 of the receiving antenna 15) at which the position of the device under test 1 is determined to be favorable is set in advance (step S52).

Then, the device under test 1 is set on a position adjustment means for the device under test 1 (step S53).

Subsequently, with transmission from the device under test 1 being stopped, the position of the device under test 1 is moved on a predetermined axis line by a predetermined amount (step S54).

When it is obvious that transmission from the device under test 1 is being stopped, there is no need to bring the device under test 1 into a state in which transmission from the device under test 1 is being stopped.

Immediately after setting the device under test 1 at step S51 the device under test 1 does not need to be moved.

Then, to measure a reflection coefficient value S22 of the receiving antenna 15, power of a radio wave of the desired frequency to be measured is applied in advance to a measurement end of the receiving antenna 15 and power reflected from the receiving antenna 15 is measured through the measurement end and then a reflection coefficient value S22 of the receiving antenna 15 is measured (step S55).

Subsequently, the threshold value which is set in advance to determine that the position of the device under test 1 is favorable is compared with a value (e.g., return loss) corresponding to the reflection coefficient value S22 of the receiving antenna 15 which is measured at step S55, to determine whether the return loss is better than 10 dB (in the case of return loss, the higher the numeric value the better the position.

For example, if the return loss is 9 dB then it is determined to be "not favorable", and if the return loss is 11 dB then it is determined to be "favorable" (step S56).

Then, if it is determined by the determination at step S56 that the value corresponding to the reflection coefficient value S22 of the receiving antenna 15 which is measured at step S55 is better than the threshold value which is set in advance, then processing proceeds to a process at step S57 which will be described later.

If it is determined by the determination at step S56 that the value corresponding to the reflection coefficient value S22 of the receiving antenna 15 which is measured at step S55 is not better than the threshold value which is set in advance, then processing returns to step S54 and the processes at steps S55 to S56 are repeated until it is determined by determination at step S56 that a value corresponding to a reflection coefficient value S22 of the receiving antenna 15 which is measured at step S55 is better than the threshold value which is set in advance.

Then, at step S57, transmission of a continuous wave from the device under test 1 starts.

Subsequently, a received power value PL of the receiving antenna 15 is measured through the measurement end of the receiving antenna 15 (step S58).

Then, based on equation (1), power proportional to a total radiation power value Pr of the device under test 1 is calculated (step S59).

Sixth Embodiment

Figure 4:
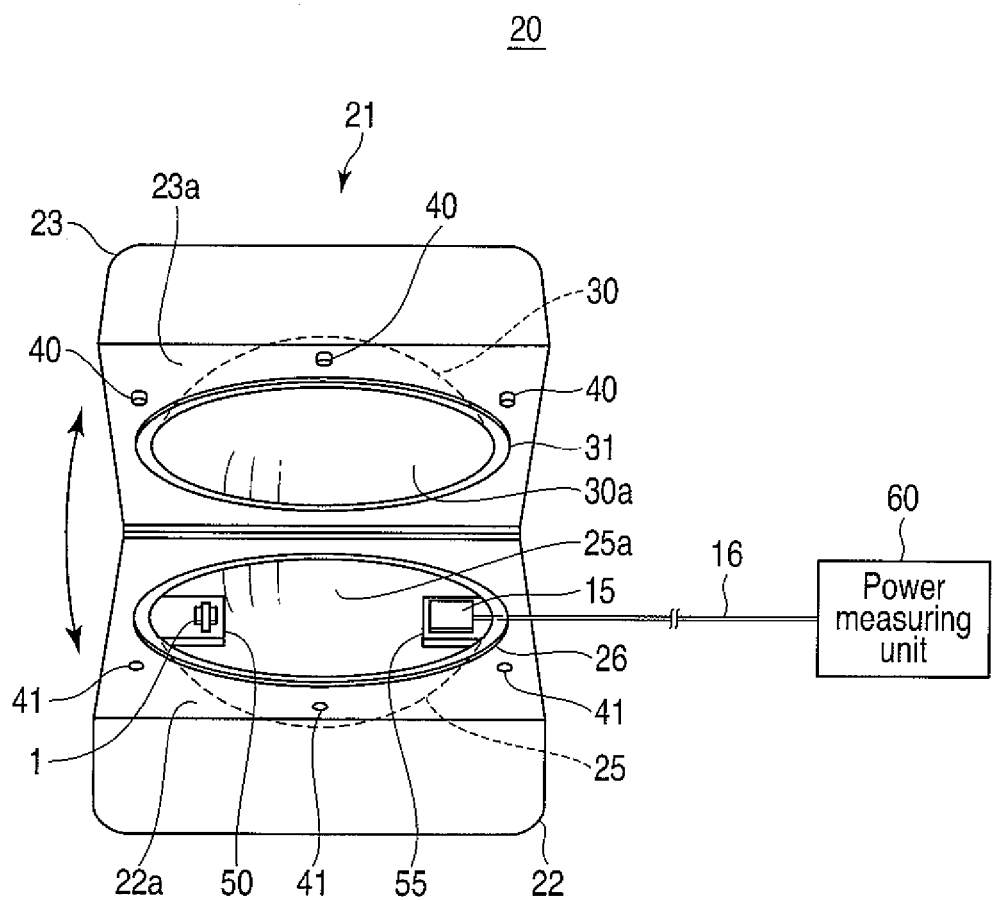
FIG. 4 is a diagram illustrated to describe a configuration of a coupler (21) for measuring a radiation power used in a method for measuring a radiation power and an apparatus for measuring a radiation power according to a sixth embodiment of the present invention, and a connection configuration between the coupler (21) for measuring a radiation power and a power measuring unit (60).

FIG. 4 illustrates a configuration of an apparatus for measuring a radiation power 20 according to a sixth embodiment of the present invention which is based on the method for measuring a radiation power according to the first embodiment.

The apparatus 20 for measuring a radiation power has a coupler 21 for measuring a radiation power (hereinafter, simply referred to as the coupler) and a power measuring unit 60.

The coupler 21 is provided with a wall surface 11 that encloses a closed space 12 of the above-described elliptical mirror 10; a device under test supporting member 50 serving as a means for supporting a device under test 1 such that the radiation center position of the device under test 1 is located in the position of one focal point F1 in the closed space 12; and a receiving antenna supporting member 55 serving as a means for supporting a receiving antenna 15 such that the center of the receiving antenna 15 is located in the position of the other focal point F2 in the closed space 12.

The coupler 21 is structured such that the closed space 12 can be opened and closed to allow the device under test 1 and the receiving antenna 15 to be put in and taken out of the closed space 12 of the elliptical mirror 10.

That is, the coupler 21 is of an open/closed type which is configured by separate pieces, a lower case 22 and an upper cases 23.

A first inner-wall forming body 25 having an inner wall 25a shaped along an outer shape of a lower half portion of the closed space 12 of the elliptical mirror 10 is mounted in an elliptical hole (not illustrated) formed in a top plate 22a of the lower case 22.

The first inner-wall forming body 25 is formed by, for example, performing press work on a metal plate or metal mesh plate that reflects radio waves or depositing a metal film onto an inner wall of a molded article of a synthetic resin.

The first inner-wall forming body 25 has, at its top rim, a flange 26 which extends slightly outward and overlaps an outer edge of the hole.

In the first inner-wall forming body 25, a portion of the flange 26 is fixed on the top plate 22a of the lower case 22.

On the other hand, a second inner-wall forming body 30 having a symmetrical shape with respect to the first inner-wall forming body 25 and formed in the same manner as the first inner-wall forming body 25 is placed in an elliptical hole (not illustrated) formed in a bottom plate 23a of the upper case 23.

Specifically, the second inner-wall forming body 30 has an inner wall 30a shaped along an outer shape of an upper half portion of the closed space 12 of the elliptical mirror 10 and has, at its rim portion on the opening side, a flange 31 which extends slightly outward and overlaps an outer edge of the hole of the upper case 23.

A portion of the flange 31 is fixed on the bottom plate 23a.

The upper case 23 is coupled to the lower case 22 by a hinge mechanism, a locking mechanism, etc., which are not illustrated, in an openable/closable manner. When the upper case 22 is closed to come on top of the lower case 23 and then locked, as illustrated in FIG. 5, the flange 26 of the first inner-wall forming body 25 and the flange 31 of the second inner-wall forming body 30 wholly come into plane contact with each other with no gap therebetween and their respective inner walls 25a and 30a continue, forming a closed space 12 of an elliptical spherical shape which is enclosed by the above-described wall surface 11.

In the lower case 22 and the upper case 23 is formed a positioning mechanism (e.g., guide pins 40 and guide holes 41 that receive the guide pins 40, as illustrated in FIG. 4) so that when the lower case 22 and the upper case 23 are closed they come on top of each other with the upper and lower inner-wall forming bodies 25 and 30 being not misaligned.

For example, as illustrated in FIG. 6(a), elastic ribs 45 are provided in a protruding manner over the entire inner rim of one inner-wall forming body 30 on the opening side.

By this, as illustrated in FIG. 6(b), when one inner-wall forming body 30 is attached to the other inner-wall forming body 25, the elastic ribs 45 come into contact with the entire inner rim of the inner-wall forming body 25 on the opening side, whereby contact portions of the flanges 26 and 31 of the inner-wall forming bodies 25 and 30 are covered, enabling to reduce a radio wave leakage, etc., which occur when a gap is created between the contact portions.

The direction in which the wall surface 11 forming the closed space 12 of the above-described elliptical mirror 10 is divided will now be discussed.

As described above, when the length direction of a dipole antenna element is caused to coincide with an elliptical long axis line of the elliptical mirror 10, a current flowing through the wall surface 11 of the elliptical mirror 10 flows in a direction along a meridional plane including the elliptical long axis line.

Therefore, when, as described above, the inner-wall forming bodies 25 and 30 are formed such that the closed space 12 of the elliptical sphere 10 is divided by a plane along the long axis line, since a direction of a gap created by the division and the above-described current flowing direction are parallel to each other and thus the current is not interrupted, a radio wave leakage from the gap can be suppressed.

However, taking into account the case of measuring, using a common coupler 21, a device under test 1 having characteristics that the direction of a current flowing through the wall surface is completely different, it is difficult to prevent a radio wave leakage from a gap between the divided planes of the cases. Thus, there is a need to prevent a radio wave leakage by, as described above, covering the contact portions (divided planes) of the flanges 26 and 31 by the elastic ribs 45 or providing an overlapping portion at a portion where the two inner-wall forming bodies 25 and 30 are stacked on top of each other.

An example is illustrated in which the top plate 22a of the lower case 22 and the first inner-wall forming body 25, and the bottom plate 23a of the upper case 23 and the second inner-wall forming plate 30 are formed as individual units.

Thus, the top plate 22a of the lower case 22 and the first inner-wall forming body 25, and the bottom plate 23a of the upper case 23, the second inner-wall forming plate 30, and a top plate 22 may be formed as a single unit using the same material.

Although the outer shapes of the first inner-wall forming body 25 and the second inner-wall forming body 30 are semi-elliptical outer shapes, the outer shape is any as long as the inner walls 25a and 30a are along the closed space 12 of the above-described elliptical mirror 10.

As illustrated in FIG. 7(a), the device under test supporting member 50 configured to support the device under test 1 in the closed space 12 of the elliptical mirror 10 is provided in the position of the focal point F1 on an opening plane of the first inner-wall forming body 25.

As illustrated in FIG. 7(b), the receiving antenna supporting member 55 configured to support the receiving antenna 15 in the closed space 12 of the elliptical mirror 10 is provided in the position of the focal point F2.

As illustrated in FIG. 7(a), the device under test supporting member 50 is configured to support the device under test 1 such that the center of radiation of the device under test 1 substantially coincides with the position of the focal point F1, and is configured by a supporting plate 51 of a synthetic resin with a high transmittance relative to radio waves; and a fixture 52 that fixes the device under test 1 on the supporting plate 51.

The fixture 52 is made of, for example, a stretchable band member that does not affect radio wave propagation, and fixes the device under test 1 in any position in a predetermined range including the focal point F1 on the supporting plate 51.

The device under test supporting unit 50 also has the function (not illustrated) of supporting a standard antenna 100 for calibration which will be described later.

As illustrated in FIG. 7(b), the receiving antenna supporting member 55 is configured by a supporting plate 56 of a synthetic resin with a high transmittance relative to radio waves; and fixtures 57 that fix the receiving antenna 15 on the supporting plate 51.

The receiving antenna 15 is generally one in which an antenna element 15b is printed and formed by performing an etching process on a printed board 15a.

The fixtures 57 configured to fix such a receiving antenna 15 fix the receiving antenna 15 with, for example, screws or clips made of a synthetic resin that do not change the characteristics of the receiving antenna 15, such that the center of reception (radiation) of the antenna element 15b of the receiving antenna 15 coincides with the focal point F2 on the supporting plate 56.

As the receiving antenna 15, one having equal gain in all directions is ideal but such an ideal receiving antenna 15 does not exist.

Therefore, it is realistic to use a dipole antenna, such as that illustrated in FIG. 7(b), in which the length of the antenna element 15b is sufficiently short relative to a wavelength and the directivity is relatively broad, or a bow-tie antenna in which the element width is increased to achieve a wide band, or the like.

For the receiving antenna 15, an antenna having a high reception sensitivity and small scattering (re-reflection) is desirable. Thus, when such an antenna is used as the receiving antenna 15, a radio wave absorber which will be described later becomes unnecessary or a radio wave absorber with small absorption characteristics can be used.

In the case of a dipole system antenna, the gain in the length direction of the antenna element 15b is very small. Hence, by using this directivity, as illustrated in FIG. 7(b), by causing the length direction of the antenna element 15b to coincide with a radiation center direction (the direction of the focal point F1) of the device under test 1, the influence of a direct wave from the device under test 1 to the receiving antenna 15 can be reduced to the smallest possible extent.

Also, in the case of a dipole system antenna, a longitudinal direction of an element thereof is co-polarization and the gain for cross-polarization components which are orthogonal to the co-polarization is very small (so-called single linear polarization).

An antenna of a UWB terminal or RFID tag which is a measurement target is designed for linear polarization and has characteristics that almost all radiation power is single linear polarization components and a small amount of cross-polarization components are added thereto.

Therefore, when the device under test 1 is single linear polarization where cross-polarization components are negligible, an orientation of the device under test 1 is determined and fixed such that a polarization direction thereof coincides with a co-polarization direction of the receiving antenna 15.

When the device under test 1 is not single polarization, i.e., the power of cross-polarization components is not negligible relative to co-polarization components, total radiation power of the device under test 1 is found as follows.

First, an orientation of the device under test 1 is determined and fixed such that a co-polarization direction of the device under test 1 coincides with a co-polarization direction of the receiving antenna 15, and radiation power thereof is measured.

Then, an orientation of the device under test 1 is determined and fixed such that a cross-polarization direction of the device under test 1 coincides with the co-polarization direction of the receiving antenna 15, and radiation power thereof is measured.

Then, radiation powers obtained as a result of the two measurements are summed, whereby total radiation power of the device under test 1 is found.

Though not illustrated, when, as the receiving antenna 15, a loop antenna or two-element orthogonal dipole that can simultaneously receive orthogonal polarization components is adopted, total radiation power of the device under test 1 can be found by a single measurement.

Total radiation power of the device under test 1 can also be found by changing the posture of the device under test 1 or changing the orientation of the receiving antenna 15 and finding radiation powers of respective polarization components and then summing the radiation powers.

In this case, it is convenient, for example, to structure the receiving antenna supporting member 55 such that it can rotate about the position of the focal point F2.

When, as illustrated in FIG. 7(b), the receiving antenna 15 is of a balanced type such as a dipole system or a loop system, the receiving antenna 15 is connected to an unbalanced type coaxial cable 16 through a balun 15c which is inserted into a feeding point of the receiving antenna 15.

A signal S received by the receiving antenna 15 is outputted external to the coupler 21 through the coaxial cable 16.

The coaxial cable 16, for example, passes through a hole made in a lower portion of the flange 26 of the inner-wall forming body 25, and is pulled out of the coupler 21 and connected to an input end of the power measuring unit 60.

The power measuring unit 60 can be configured by a simple power meter, if used for continuous wave measurement.

Thus, in order to be able to support the case of burst waves, as illustrated in FIG. 8, the power measuring unit 60 has a spectrum analysis module 61, a time waveform data calculation module 62, a primary wave extraction module 63, a primary wave spectrum calculation module 64, and a radiation power calculation module 65.

The spectrum analysis module 61 performs a spectrum analysis for a frequency domain of radio waves radiated from the device under test 1, on an output signal S from the receiving antenna 15 and generates frequency vs. level spectrum waveform data.

The time waveform data calculation module 62 performs an inverse Fourier transform operation on the spectrum data generated by the spectrum analysis module 61 and calculates time waveform data for the output signal S from the receiving antenna 15.

The primary wave extraction module 63 extracts time waveform data of a primary wave that is radiated from the device under test 1 and reflected once at the wall surface 12 of the elliptical mirror 10 and then reaches the receiving antenna 15, from the time waveform data calculated by the time waveform data calculation module 62.

The primary wave spectrum calculation module 64 performs a Fourier transform process on the time waveform data of the primary wave which is extracted by the primary wave extraction module 63, and thereby obtains spectrum data of the primary wave.

Then, the radiation power calculation module 65 performs an integration process on the spectrum data of the primary wave which is calculated by the primary wave spectrum calculation module 64 and thereby finds total power of radio waves radiated from the device under test 1 and calculates total radiation power.

Figure 30:
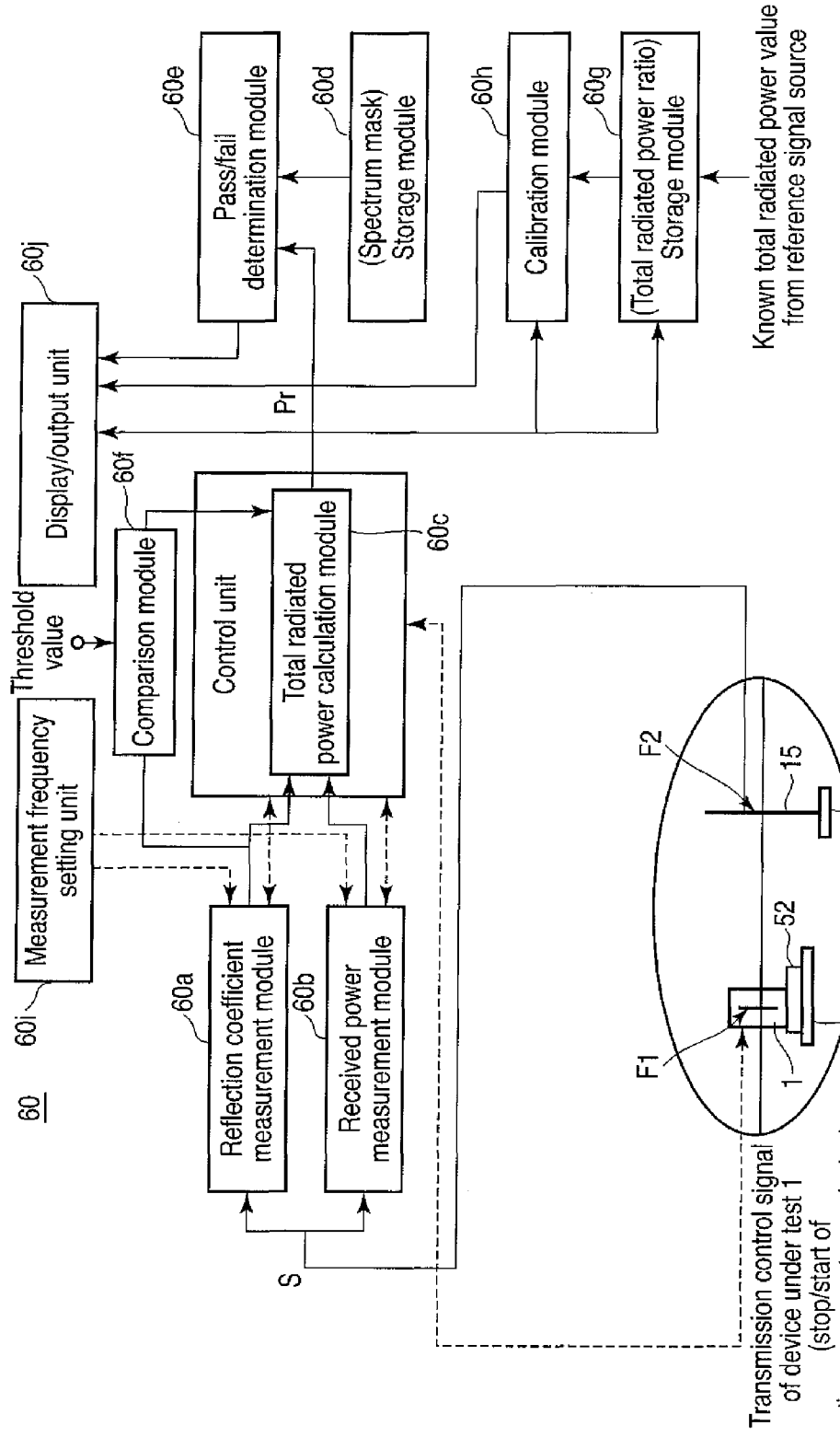
FIG. 30 is a block diagram of a main part illustrated to describe a configuration of an apparatus for measuring a radiation power according to the sixth embodiment of the present invention.

FIG. 30 is a block diagram illustrating another specific example of the power measuring unit 60.

Specifically, the power measuring unit 60 illustrated in FIG. 30 has a reflection coefficient measurement module 60a that measures a reflection coefficient value S22 of the receiving antenna 15 with radio wave radiation from the device under test 1 which is supported by the device under test supporting member 50 of the coupler 21 for radiation power measurement being stopped, by applying power having a predetermined measurement frequency to a measurement end of the receiving antenna 15 supported by the receiving antenna supporting member 55 of the coupler 21 for radiation power measurement, and measuring power reflected from the receiving antenna 15 through the measurement end; a received power measurement module 60b that measures a value of received power PL of the receiving antenna 15 through the measurement end of the receiving antenna 15 with a continuous wave having the predetermined measurement frequency being radiated from the device under test 1; and a total radiation power calculation module 60c that calculates power proportional to a total radiation power value Pr of the device under test 1, based on the reflection coefficient value S22 measured by the reflection coefficient measurement module 60a and the value of received power PL measured by the received power measurement module 60b, by the following equation:

$$PL/(1-|S22|^2).$$

The reflection coefficient measurement module 60a may be configured such that for each of a plurality of measurement frequencies which are predetermined in a predetermined frequency range, power having the predetermined measurement frequency is applied to the measurement end of the receiving antenna 15 and power reflected from the receiving antenna 15 is measured through the measurement end, whereby the reflection coefficient value S22 is sequentially measured.

The received power measurement module 60b may be configured such that for each of the plurality of measurement frequencies which are predetermined in the predetermined frequency range, with a continuous wave which has the predetermined measurement frequency being radiated from the device under test 1, received power PL of the receiving antenna 15 is sequentially measured through the measurement end of the receiving antenna 15.

Also, the total radiation power calculation module 60c may be configured such that based on a reflection coefficient value S22 which is sequentially measured by the reflection coefficient measurement module 60a for each of the plurality of measurement frequencies which are predetermined in the predetermined frequency range and a value of received power PL which is sequentially measured by the received power measurement module 60b for each of the plurality of measurement frequencies which are predetermined in the predetermined frequency range, power proportional to a total radiation power value Pr for each of the plurality of measurement frequencies is sequentially calculated by the following equation:

$$PL/(1-|S22|^2).$$

The power measuring unit 60 further has a storage module 60d that stores in advance a spectrum mask of a predetermined standard such as those illustrated in FIGS. 26 and 27, for example, which includes predetermined frequencies and predetermined output intensities for radio waves radiated from the device under test 1; and a pass/fail determination module 60e that makes a pass/fail determination as to whether power proportional to a total radiation power value Pr for each of the plurality of measurement frequencies which is sequentially calculated by the total radiation power calculation module 60c satisfies the predetermined standard, by a comparison with the spectrum mask stored in the storage module 60d.

The coupler 21 for radiation power measurement further has a position adjustment mechanism 52 that adjusts the position of the device under test 1 supported by the device under test supporting member (50), along at least one of three-dimensional coordinate axes.

The power measuring unit 60 further has a comparison module 60f that compares a value corresponding to the reflection coefficient value S22 which is measured by the reflection coefficient measurement module 60a each time the position of the device under test 1 is adjusted by the position adjustment mechanism 52, with a preset threshold value.

The total radiation power calculation module 60c is configured to start calculation of power proportional to a total radiation power value Pr of the device under test 1 using, as the reflection coefficient value S22, a value corresponding to the reflection coefficient value S22 which is determined by the comparison module 60f to be the threshold value or less.

The power measuring unit 60 further has a storage module 60g that stores in advance a ratio of total radiation power which is calculated by the total radiation power calculation module 60c by receiving, by the receiving antenna 15, known total radiation power which is transmitted from a transmitting antenna of a known reference signal source being used instead of the device under test 1, to the known total radiation power transmitted from the transmitting antenna of the known reference signal source; and a calibration module 60h that calibrates a total radiation power value which is calculated by the total radiation power calculation module 60c by receiving, by the receiving antenna 15, total radiation power of a radio wave radiated from the device under test 1 when the device under test 1 is used, using the ratio of total radiation power which is calculated by the total radiation power calculation module 60c by receiving, by the receiving antenna 15, the known total radiation power which is transmitted from the transmitting antenna of the known reference signal source, to the known total radiation power which is stored in the storage module 60g.

In FIG. 30 a measurement frequency setting unit 60i sets a measurement frequency for the reflection coefficient measurement module 60a and the received power measurement module 60b.

A display/output unit 60j is configured to display/output total radiation power itself which is calculated by the total radiation power calculation module 60c and also display/output a pass/fail determination output from the pass/fail determination module 60e and display/output a calibration output from the calibration module 60h.

Seventh Embodiment

As a seventh embodiment of the present invention, a more detailed method for measuring a radiation power using an apparatus 20 for measuring a radiation power having the above-described configuration will now be described.

In the method for measuring a radiation power according to the seventh embodiment, when total radiation power of the device under test 1 is found by the apparatus 20 for measuring a radiation power, a method of comparison with a standard system is used.

Figure 9:
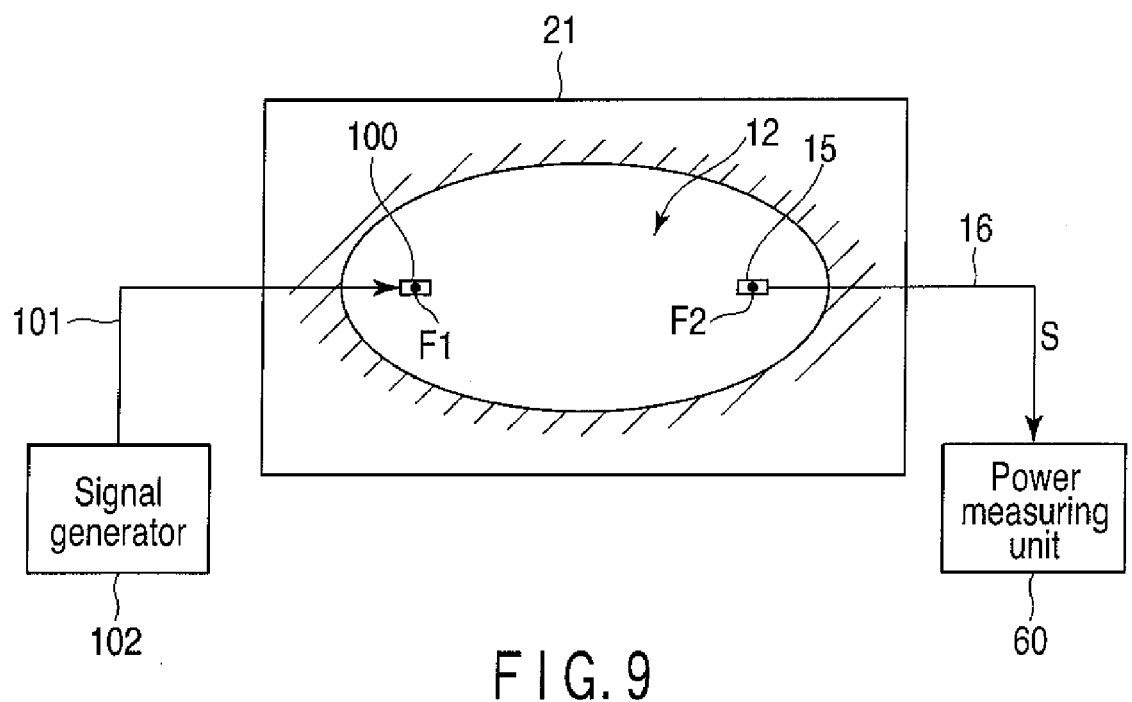
FIG. 9 is a diagram illustrated to describe a configuration of a standard system used in a method for measuring a radiation power and an apparatus for measuring a radiation power according to a seventh embodiment of the present invention.

As illustrated in FIG. 9, the standard system is configured by a standard antenna 100 having substantially the same directivity as the device under test 1 and having a known radiation efficiency (or internal loss), a coaxial cable 101 for connection having a known loss, and a signal generator 102.

As described above, the device under test supporting member 50 is formed to be able to support the standard antenna 100 such that the center of radiation of the standard antenna 100 substantially coincides with a focal point F1.

The coaxial cable 101 can be, for example, pulled out through a hole in a lower portion of the flange 26 of the lower case 22 of the coupler 21 illustrated in FIG. 4.

In the standard system illustrated in FIG. 9, when the transmission output from the signal generator 102 is P0, the connection cable loss is Lc, the standard antenna reflection coefficient is $\Gamma$, and the radiation efficiency of a transmitting antenna is $\eta$, total power TRPr radiated from the standard antenna 100 is represented by:

$$TRPr = P0 \cdot (1-|\Gamma|^2) \cdot Lc \cdot \eta.$$

When the reception output from a receiving antenna 15 for this time is Pr and the reception output obtained when the device under test 1 is measured is Px, since it can be considered that power radiated from the device under test 1 into a closed space 12 of an elliptical mirror 10 is proportional to an output received by the receiving antenna 15, total radiation power TFPx of the device under test 1 is found by:

$$TRPx = P0 \cdot (1-|\Gamma|^2) \cdot Lc \cdot \eta \cdot Px/Pr.$$

The above-described method of comparison is based on the assumption that a ratio Px/Pr between received powers of primary waves which are found for the standard system and the device under test, respectively, is equal to a ratio between total radiation powers from the standard system and the device under test 1 in free space. Next, description that this assumption is right will be made.

FIG. 12 illustrates a comparison between input reflection coefficients of a dipole antenna with an element length (Ld) of 25 mm for three cases.

In FIG. 12, A indicates a reflection coefficient obtained for a signal when the dipole antenna is disposed in a closed space 12 of an elliptical mirror 10 with a long-axis diameter a=200 mm (long-axis length of 400 mm) and a short-axis diameter b=133 mm (short-axis length of 266 mm).

In FIG. 12, B indicates a reflection coefficient found by extracting a primary wave from the signal indicated by A in FIG. 12, and C indicates a reflection coefficient for when the dipole antenna is disposed in free space.

While the characteristic of A in FIG. 12 fluctuates intensely and greatly differs from the characteristic of C in FIG. 12, the characteristic of the reflection coefficient of B in FIG. 12 obtained by extracting a primary wave and the characteristic of the reflection coefficient of C match well, though there is a slight difference in resonance frequency therebetween, and the difference in radiation power brought about by the difference in reflection coefficient is 0.5 dB or less in a range of from 3 to 10 GHz.

A ratio between radiation powers of dipole antennas having different lengths will now be discussed.

The case will be considered in which supposedly a dipole with an element length of 20 mm is the standard antenna 100 and a dipole with an element length of 25 mm is the device under test 1 and they are disposed in the closed space 12 of the above-described elliptical mirror 10 with a long-axis diameter a=200 mm and a short-axis diameter b=133 mm.

In either case, a dipole with an element length 20 mm is used as the receiving antenna 15.

FIG. 13 illustrates results of obtaining an output current (impulse response) of the receiving antenna 15 when an impulse is provided to the standard antenna 100 with an element length of 20 mm.

FIG. 13(*a*) illustrates time response and FIG. 13(*b*) illustrates frequency response.

In the time response illustrated in FIG. 13(*a*) multiple reflections clearly appear, and in the frequency response illustrated in FIG. 13(*b*), too, complicated ripples caused thereby appear.

When a primary wave illustrated in FIG. 13(*a*) is extracted and subjected to a Fourier transform process and the resultant is represented in a frequency domain, a gentle curve spectrum characteristic illustrated in FIG. 13(*b*) is obtained.

FIG. 14 illustrates results of obtaining an impulse response which is the same as that described above, for the device under test 1 with an element length of 25 mm.

A characteristic E indicated by a solid line in FIG. 15 illustrates a result of obtaining a ratio (dB) between received currents in the frequency domain of primary waves which are obtained for the standard antenna 100 and the device under test 1.

A characteristic G indicated by a broken line in FIG. 15 illustrates a ratio between radiation powers in free space of the two antennas.

This is a ratio between $(1-\Gamma 2)$ taken from the reflection coefficients F of the respective antennas. In this case, since it is assumed that there is no internal loss in the antennas, the ratio between $(1-\Gamma 2)$ represents a ratio between total radiation powers.

Comparing the characteristics E and G illustrated in FIG. 15, it can be seen that they substantially match each other over the entire frequency range.

From these simulation results, it can be seen that the ratio between received currents which is calculated for the two different antennas based on spectra obtained by extracting primary waves and performing a Fourier transform on the primary waves is substantially equal to the ratio between total radiation powers of the two antennas.

From the above, it can be seen that the ratio Px/Pr between received powers of primary waves which are found for the standard system and the device under test 1, respectively, is substantially equal to the ratio between total radiation powers of the standard system and the device under test 1 in free space.

FIG. 31 is a flowchart illustrated to describe an example of specific operations in the method for measuring a radiation power according to the seventh embodiment.

The method for measuring a radiation power according to the seventh embodiment of the present invention is configured such that step S5 in the aforementioned second embodiment where a received power value PL of the receiving antenna 15 is measured includes steps S5*b*1 and S5*b*2 such as those illustrated in FIG. 31.

First, when the received power value PL is measured, a ratio of total radiation power which is measured by receiving, by the receiving antenna 15, known total radiation power which is transmitted from a known reference signal source being used instead of the device under test 1, to the known total radiation power is stored in advance (step S5*b*1).

Then, using the ratio of total radiation power which is measured by receiving, by the receiving antenna 15, the known total radiation power to the known total radiation power, which is stored in advance at the above-described step S5*b*1, a total radiation power value which is measured by receiving, by the receiving antenna 15, total radiation power of a radio wave radiated from the device under test 1 when the device under test 1 is used is calibrated (step S5*b*2).

Therefore, according to the method for measuring a radiation power according to the seventh embodiment of the present invention, at step S7, power proportional to a total radiation power value Pr of the device under test 1 is calculated based on the received power PL calibrated at the above-described step S5*b*2 and the reflection coefficient value S22 measured at the above-described step S6, by the above-described equation (1).

Eighth Embodiment

As an eighth embodiment of the present invention, a more detailed method for measuring a radiation power using an apparatus 20 for measuring a radiation power having the above-described configuration will now be described.

In the method for measuring a radiation power according to the eighth embodiment, a measurement target of total radiation power is a primary wave and thus other components are reduced using a radio wave absorber.

Namely, a measurement target of total radiation power is a primary wave and other components can be reduced using a radio wave absorber, in addition to the use of a method of removing the components by the above-described signal processing.

Figure 10:
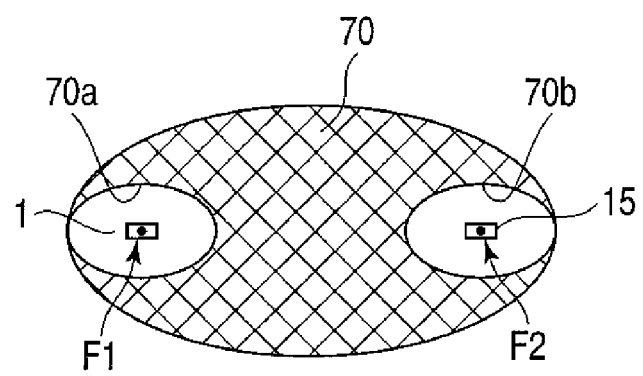
FIG. 10 is a diagram illustrated to describe a radio wave absorber (70) used in a method for measuring a radiation power and an apparatus for measuring a radiation power according to an eighth embodiment of the present invention.

For example, as illustrated in FIG. 10, by putting, in a closed space 12 of an elliptical mirror 10, a plate-like radio wave absorber 70 which overlaps a horizontal plane including a long axis, higher-order multiple reflection components can be significantly reduced.

Figure 11:
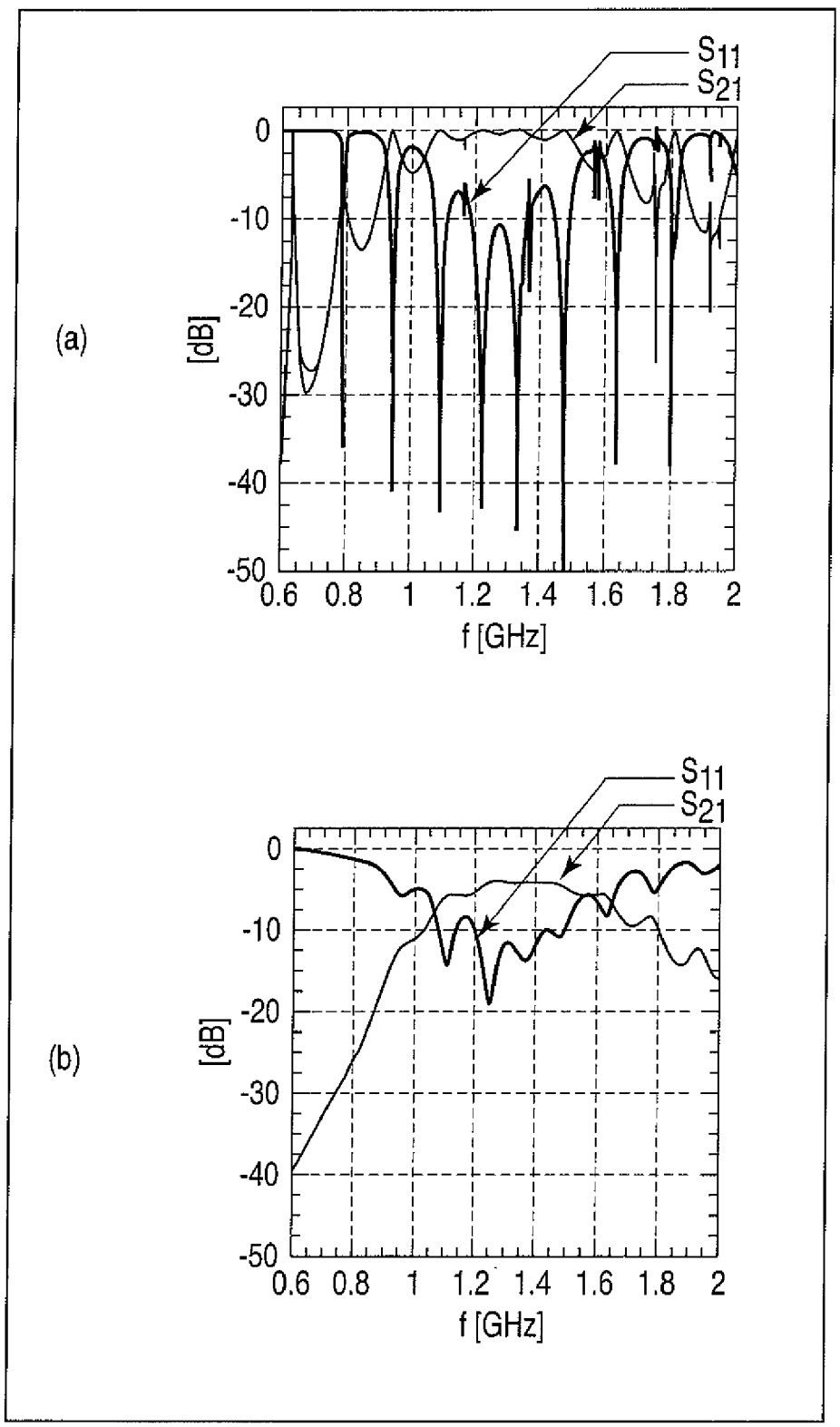
FIG. 11 is a diagram illustrated to describe a change in characteristics brought about by the presence/absence of the radio wave absorber (70) used in the method for measuring a radiation power and the apparatus for measuring a radiation power according to the eighth embodiment of the present invention.

FIG. 11 illustrates simulation results thereof.

In this case, the configuration is such that both a transmitting antenna of a device under test 1 and a receiving antenna 15 are dipole antennas with a center frequency of 1.2 GHz and they are disposed in a closed space 12 of an elliptical mirror 10 which is obtained by rotating an ellipse with a long-axis length (2a) of 60 cm and a short-axis length (2b) of 40 cm 350 degrees about a long axis thereof.

At this time, by causing length directions of elements of the two dipole antennas to coincide with the long axis, direct coupling between the two antennas is suppressed.

FIG. 11(a) illustrates a reflection coefficient S11 of the transmitting antenna and a transmission coefficient S21 from the transmitting antenna to the receiving antenna for the case of no radio wave absorber.

FIG. 11(b) illustrates a reflection coefficient S11 and a transmission coefficient S21 for the case in which a radio wave absorber 70 having a form in which the entire radio wave absorber 70 is of an elliptical plate and portions around the transmitting and receiving antennas (elliptical spherical spaces in a range of an equal distance from each of focal points F1 and F2 to both ends in a long-axis direction, and with a distance of 70 mm in a short-axis direction) are cut out is disposed in a central horizontal plane.

When, as illustrated in FIG. 11(a), there is no radio wave absorber 70, large resonances occur at some frequencies and a spike-like large drop occurs in the transmission coefficient (S21).

On the other hand, when, as illustrated in FIG. 11(b), the radio wave absorber 70 is inserted, although the degree of coupling between the two antennas slightly decreases, a stable transmission characteristic with little drop over a wide frequency range is obtained, indicating that a standing wave is not set up.

The fact that a standing wave is thus not set up indicates that higher-order reflections of secondary or higher order waves can be neglected.

That is, by this, when the radio wave absorber 70 is inserted, only a primary wave is measured.

With such a method for measuring a radiation power according to the eighth embodiment, even for signals in a narrow band in which it is difficult to temporally separate a primary wave and higher-order reflected waves, total radiation power TRP of a device under test 1 serving as a measurement target can be found using the above-described method of comparison.

SUMMARY OF THE PRESENT INVENTION

As such, in accordance with an aspect of the present invention, a device under test 1 is disposed at one focal point F1 of an elliptical mirror 10 having a closed space 12 which has an elliptical spherical shape obtained by rotating an ellipse 360 degrees about an axis passing through two focal points F1 and F2 thereof and which is enclosed by a metal wall surface 11, such that the center of radiation of a radio wave therefrom is positioned at the focal point F1, and a radio wave radiated from the device under test 1 is caused to be reflected at the wall surface 11 of the elliptical mirror 10 to allow a receiving antenna 15 disposed at the other focal point F2 to receive the radio wave, and radiation power of the device under test 1 is measured in accordance with an output signal from the receiving antenna 15.

Therefore, in accordance with an aspect of the present invention, total radiation power of a radio wave radiated from the device under test 1 can be measured with a simple configuration, in small size, in a short time, and with high sensitivity.

(Definition of the Elliptical Mirror 10)

The elliptical mirror 10 in accordance with an aspect of the present invention may be one having a closed space 12 which has a semi-elliptical spherical shape obtained by rotating an ellipse A illustrated in FIG. 4 180 degrees instead of 360 degrees about an axis line passing through two focal points F1 and F2 thereof and which is enclosed by a metal wall surface 11.

In the closed space 12 of such an elliptical mirror 10, a device under test 1 is disposed at one focal point F1 such that the center of radiation of a radio wave therefrom is positioned at the focal point F1, and a radio wave radiated from the device under test 1 is caused to be reflected at the wall surface 11 of the elliptical mirror 10 to allow a receiving antenna 15 disposed at the other focal point F2 to intensively receive the radio wave, whereby radiation power of the device under test 1 can be measured in accordance with an output signal from the receiving antenna 15.

In this case, when, as the elliptical mirror 10, one is used that has a closed space 12 having a semi-elliptical spherical shape of the side of a lower case 22 illustrated in FIG. 4 and enclosed by a metal wall surface 11, and a plate-like radio wave absorber is simply placed on the side of an upper case 23, radiation power of the device under test 1 can be measured in accordance with a value obtained by doubling an output signal from the receiving antenna 15.

When, as the elliptical mirror 10, one is used that has a closed space 12 having a semi-elliptical spherical shape of the side of a lower case 22 illustrated in FIG. 4 and enclosed by a metal wall surface 11, and a plate conductor made of a metal, etc., is simply placed on the side of an upper case 23, since an image signal by the plate conductor made of a metal, etc., appears in an output signal from the receiving antenna 15, radiation power of the device under test 1 can be measured in accordance with the output signal from the receiving antenna 15.

Also, the present invention may be performed using, as the elliptical mirror 10 in accordance with an aspect of the present invention, one having a shape obtained by cutting an elliptical spherical space in a plane parallel to a short-axis line of an ellipse A illustrated in FIG. 4.

In this case, on a plane of a cut surface is placed a radio wave absorber or a conductor.

When a radio wave absorber is placed on the plane of the cut surface, since received power of the receiving antenna 15 is one-half, when total radiation power is calculated in accordance with an output signal from the receiving antenna 15, the output signal is doubled.

When a conductor is placed on the plane of the cut surface, since this plane portion operates as a ground and received power does not change, when total radiation power of the device under test 1 is measured in accordance with an output signal from the receiving antenna 15, the output signal does not need to be doubled.

Also, the present invention may be performed using, as the elliptical mirror 10 in accordance with an aspect of the present invention, one having a region obtained by sectioning an elliptical spherical space by a plane formed by an original short-axis line when a plane parallel to a short-axis line of an ellipse illustrated in FIG. 4 is rotated 90 degrees about a long axis, and a plane obtained by rotating the plane 90 degrees, i.e., one having a shape obtained by cutting an elliptical spherical space by one-quarter.

In this case, when a radio wave absorber is placed on a plane of a cut surface, since received power of the receiving antenna 15 is one-quarter, when total radiation power is calculated, an output signal from the receiving antenna 15 is quadrupled.

When a conductor is placed on the plane of the cut surface, since a plane portion operates as a ground and received power does not change, when total radiation power is calculated, an output signal from the receiving antenna 15 does not need to be quadrupled.

Accordingly, the elliptical mirror 10 referred to in the present invention may be one having a closed space 12 which has an elliptical spherical shape, a semi-elliptical spherical shape, a quarter-elliptical spherical shape, etc., obtained by rotating an ellipse A illustrated in FIG. 4 by a predetermined angle about at least one of a long-axis line and a short-axis line thereof, and which is enclosed by a wall surface 11.

With the coming of a ubiquitous network environment, when a radio wave radiated from a very small wireless communication terminal such as a Radio frequency identification tag (RFID) or a UWB (Ultra-wide-band) or BAN (Body Area Network) related radio device is received and a test is conducted on the radio wave, a method for measuring a radiation power, a coupler for measuring a radiation power, and an apparatus for measuring a radiation power in accordance with an aspect of the present invention can measure Total radiation power (TRP) radiated in the entire space, with a simple configuration, in a short time, and with high sensitivity.

What is claimed is:

1. A method for measuring a radiation power comprising:
    preparing an elliptical mirror having a closed space which has an elliptical spherical shape and which is enclosed by a metal wall surface, the elliptical spherical shape being obtained by rotating an ellipse by a predetermined angle about an axis line passing through two focal points thereof;
    placing a device under test which can radiate a radio wave, in a position of one of the two focal points in the closed space of the elliptical mirror such that a center of radiation of a radio wave therefrom substantially coincides with the focal point;
    placing a receiving antenna in a position of an other one of the two focal points in the closed space of the elliptical mirror; and
    in the closed space of the elliptical mirror, causing the device under test disposed in the position of the one focal point to radiate a radio wave and causing the radio wave radiated from the device under test to be reflected at the wall surface to allow the receiving antenna disposed in the position of the other focal point to receive the radio wave, and
    measuring total radiation power of the radio wave radiated from the device under test at a measurement end of the receiving antenna in accordance with an output signal from the receiving antenna, the measuring total radiation power comprising:
    with a continuous wave being radiated from the device under test, measuring a received power value PL of the receiving antenna through the measurement end of the receiving antenna, the continuous wave having a predetermined measurement frequency;
    with the radio wave radiation from the device under test being stopped, applying power having the predetermined measurement frequency to the measurement end of the receiving antenna and measuring power reflected from the receiving antenna through the measurement end, whereby a reflection coefficient value S22 of the receiving antenna is measured; and
    based on the value of received power PL which is measured in the step of measuring a received power value PL of the receiving antenna, and the reflection coefficient value S22 which is measured in the step of measuring a reflection coefficient value S22 of the receiving antenna, calculating power proportional to a total radiation power value Pr of the device under test by a following equation:

$PL/(1-|S22|^2)$.

2. The method for measuring a radiation power according to claim 1, wherein measuring total radiation power at a measurement end of the receiving antenna comprises:
    for each of a plurality of measurement frequencies which are predetermined in a predetermined frequency range, with a continuous wave which has the predetermined measurement frequency being radiated from the device under test, sequentially measuring received power PL of the receiving antenna through the measurement end of the receiving antenna:
    for each of said plurality of measurement frequencies which are predetermined in the predetermined frequency range, applying power having the predetermined measurement frequency to the measurement end of the receiving antenna and sequentially measuring power reflected from the receiving antenna through the measurement end, whereby the reflection coefficient value S22 of the receiving antenna is sequentially measured; and
    based on the received power PL which is sequentially measured for each of said plurality of measurement frequencies and the reflection coefficient value S22 which is sequentially measured for each of said plurality of measurement frequencies, sequentially calculating power proportional to a total radiation power value Pr for each of said plurality of measurement frequencies by a following equation:

$PL/(1-|S22|^2)$.

3. The method for measuring a radiation power according to claim 1, further comprising:
    storing in advance a spectrum mask of a predetermined standard for radio waves radiated from the device under test, the spectrum mask including predetermined frequencies and predetermined output intensities; and
    making a pass/fail determination by a comparison with the spectrum mask, as to whether the power proportional to the total radiation power value Pr which is calculated in the step of calculating power proportional to a total radiation power value Pr of the device under test satisfies the predetermined standard.

4. The method for measuring a radiation power according to claim 1, wherein measuring total radiation power at a measurement end of the receiving antenna comprises:
    adjusting a position of the device under test along at least one of three-dimensional coordinate axes which intersect one another;

each time the position of the device under test is adjusted in the step of adjusting a position, with radio wave radiation from the device under test being stopped, applying power having a predetermined measurement frequency to the measurement end of the receiving antenna and measuring power reflected from the receiving antenna through the measurement end, whereby a value corresponding to a reflection coefficient value S22 of the receiving antenna is measured;

comparing the value corresponding to a reflection coefficient value S22 of the receiving antenna which is measured in the step of measuring a value corresponding to a reflection coefficient value S22 of the receiving antenna, with a preset threshold value;

setting, as the reflection coefficient value S22, a value corresponding to a reflection coefficient value S22 which is measured in the step of measuring a value corresponding to a reflection coefficient value S22 of the receiving antenna and which is determined, by a comparison in the step of comparing with a threshold value, to be the threshold value or less;

with a continuous wave which has the predetermined measurement frequency being radiated from the device under test, measuring a received power value PL of the receiving antenna through the measurement end of the receiving antenna; and based on the received power value PL of the receiving antenna which is measured in the step of measuring a received power value PL of the receiving antenna, and the value corresponding to a reflection coefficient value S22 which is set as the reflection coefficient value 322 in the step of setting as the reflection coefficient value S22, starting calculation of power proportional to a total radiation power value Pr of the device under test by a following equation:

$$PL/(1-|S22|^2).$$

5. The method for measuring a radiation power according to claim 1, wherein in the step of measuring total radiation power at a measurement end of the receiving antenna, a signal corresponding to a primary wave that is radiated from the device under test and reflected once at the wall surface and then reaches the position of the other focal point, is extracted from output signals from the receiving antenna and total radiation power of the device under test is measured.

6. The method for measuring a radiation power according to claim 1, wherein measuring a received power value PL of the receiving antenna comprises:

storing in advance a ratio of total radiation power which is measured by receiving, by the receiving antenna, known total radiation power which is transmitted from a known reference signal source being used instead of the device under test, to the known total radiation power; and calibrating a total radiation power value which is measured by receiving, by the receiving antenna, total radiation power of a radio wave radiated from the device under test when the device under test is used, using the ratio of total radiation power which is measured by receiving, by the receiving antenna, known total radiation power to the known total radiation power, which is stored in advance in the step of storing in advance a ratio of total radiation power which is measured by reception by the receiving antenna to the known total radiation power.

7. A coupler for measuring a radiation power configured to support a device under test which can radiate a radio wave and a receiving antenna which receives the radio wave radiated from the device under test in a closed space enclosed by a metal wall surface, receive by the receiving antenna the radio wave radiated from the device under test, and output a received signal of the receiving antenna externally, the coupler comprising:

an elliptical mirror having the closed space formed in a an elliptical spherical shape which is obtained by rotating an ellipse by a predetermined angle about an axis line passing through two focal points thereof;

a device under test supporting member which supports the device under test in a position of one of the two focal points in the closed space of the elliptical mirror such that a center of radiation of a radio wave therefrom substantially coincides with the focal point;

a receiving antenna supporting member which supports the receiving antenna in a position of an other one of the two focal points in the closed space of the elliptical mirror such that a center position thereof substantially coincides with the other focal point, wherein in the closed space of the elliptical mirror, a radio wave radiated from the device under test which is supported by the device under test supporting member is caused to be reflected at the wall surface to allow the receiving antenna which is supported by the receiving antenna supporting member to receive the radio wave; and a radio wave absorber in the closed space of the elliptical mirror so that multiple reflections of a radio wave radiated from the device under test can be suppressed, the radio wave absorber being provided in a region other than areas surrounding a portion where the device under test is supported and a portion where the receiving antenna is supported, and along a plane including the two focal points.

8. An apparatus for measuring a radiation power comprising:

a coupler for measuring a radiation power configured to support a device under test which can radiate a radio wave and a receiving antenna which receives the radio wave radiated from the device under test in a closed space enclosed by a metal wall surface, receive by the receiving antenna the radio wave radiated from the device under test, and output a received signal of the receiving antenna externally;

a power measuring unit which measures total radiation power of a radio wave radiated from the device under test, from a received signal of the receiving antenna to be outputted external to the coupler for measuring a radiation power, wherein the coupler for measuring a radiation power comprises:

an elliptical mirror having the closed space formed in a an elliptical spherical shape which is obtained by rotating an ellipse by a predetermined angle about an axis line passing through two focal points thereof;

a device under test supporting member which supports the device under test in a position of one of the two focal points in the closed space of the elliptical mirror such that a center of radiation of a radio wave therefrom substantially coincides with the focal point; and a receiving antenna supporting member which supports the receiving antenna in a position of an other one of the two focal points in the closed space of the elliptical mirror such that a center position thereof substantially coincides with the other focal point, wherein in the closed space of the elliptical mirror, a radio wave radiated from the device under test which is supported by the device under test supporting member is caused to be reflected at the wall surface to allow the receiving antenna which is supported by the receiving antenna supporting member to receive the radio wave, and the power measuring unit can measure total radiation power of a radio wave radiated from the device under test which is supported by the device under test supporting member, in accordance with an output signal received by the receiving antenna which is supported by the receiving antenna supporting member of the coupler for measuring a radiation power, wherein the power measuring unit comprises:

a reflection coefficient measurement module which measures a reflection coefficient value S22 of the receiving antenna with radio wave radiation from the device under test being stopped, by applying power having a predetermined measurement frequency to a measurement end of the receiving antenna and measuring power reflected from the receiving antenna through the measurement end, the device under test being supported by the device under test supporting member of the coupler for measuring a radiation power and the receiving antenna being supported by the receiving antenna supporting member of the coupler for measuring a radiation power;

a received power measurement module which measures a value of received power PL of the receiving antenna through the measurement end of the receiving antenna with a continuous wave having the predetermined measurement frequency being radiated from the device under test; and a total radiation power calculation module which calculates power proportional to a total radiation power value Pr of the device under test, based on the reflection coefficient value S22 measured by the reflection coefficient measurement module and the value of received power PL measured by the received power measurement module, by a following equation:

$$PL/(1-|S22|^2).$$

9. The apparatus for measuring a radiation power according to claim 8, wherein the reflection coefficient measurement module sequentially measures a reflection coefficient value S22 for each of a plurality of measurement frequencies by applying power having the predetermined measurement frequency to the measurement end of the receiving antenna and measuring power reflected from the receiving antenna through the measurement end, said plurality of measurement frequencies being predetermined in a predetermined frequency range, the received power measurement module sequentially measures received power PL of the receiving antenna through the measurement end of the receiving antenna for each of said plurality of measurement frequencies, with a continuous wave having the predetermined measurement frequency being radiated from the device under test, said plurality of measurement frequencies being predetermined in the predetermined frequency range, and the total radiation power calculation module sequentially calculates power proportional to a total radiation power value Pr for each of said plurality of measurement frequencies, based on the reflection coefficient value S22 which is sequentially measured by the reflection coefficient measurement module for each of said plurality of measurement frequencies which are predetermined in the predetermined frequency range and the value of received power PL which is sequentially measured by the received power measurement module for each of said plurality of measurement frequencies which are predetermined in the predetermined frequency range, by a following equation:

$$PL/(1-|S22|^2).$$

10. The apparatus for measuring a radiation power according to claim 9, wherein the power measuring unit further comprises:

a storage module which stores in advance a spectrum mask of a predetermined standard for radio waves radiated from the device under test, the spectrum mask including predetermined frequencies and predetermined output intensities; and a pass/fail determination module which makes a pass/fail determination as to whether power proportional to a total radiation power value Pr for each of said plurality of measurement frequencies which is sequentially calculated by the total radiation power calculation module satisfies the predetermined standard, by a comparison with the spectrum mask stored in the storage module.

11. The apparatus for measuring a radiation power according to claim 8, wherein the coupler for measuring a radiation power further comprises a position adjustment mechanism which adjusts a position of the device under test supported by the device under test supporting member, along at least one of three-dimensional coordinate axes, the power measuring unit further comprises a comparison module which compares a value corresponding to the reflection coefficient value S22 which is measured by the reflection coefficient measurement module each time the position of the device under test is adjusted by the position adjustment mechanism, with a preset threshold value, and the total radiation power calculation module starts calculation of power proportional to a total radiation power value Pr of the device under test using, as the reflection coefficient value S22, a value corresponding to the reflection coefficient value S22 which is determined by the comparison module to be the threshold value or less.

12. The apparatus for measuring a radiation power according to claim 8, wherein the power measuring unit comprises:

a spectrum analysis module which obtains spectrum data from an output signal received by the receiving antenna with a short-pulse radio wave being radiated from the device under test which is supported by the device under test supporting member of the coupler for measuring a radiation power, the receiving antenna being supported by the receiving antenna supporting member of the coupler for measuring a radiation power;

a time waveform data calculation module which performs an inverse Fourier transform operation on the spectrum data obtained by the spectrum analysis module and calculates time waveform data for the output signal from the receiving antenna;

a primary wave extraction module which extracts time waveform data of a primary wave from the time waveform data calculated by the time waveform data calculation module, the primary wave being the short-pulse radio wave which is radiated from the device under test, reflected once at the wall surface in the elliptical spherical closed space of the coupler for measuring a radiation power, and reaches the receiving antenna;

a primary wave spectrum calculation module which performs a Fourier transform process on the time waveform data of the primary wave and thereby obtains spectrum data of the primary wave, the time waveform data of the primary wave being extracted by the primary wave extraction module; and a radiation power calculation module which calculates total radiation power of the device under test from the spectrum data of the primary wave which is calculated by the primary wave spectrum calculation module.

13. The apparatus for measuring a radiation power according to claim 8, wherein the power measuring unit further comprises:

a storage module which stores in advance a ratio of total radiation power which is calculated by the total radiation power calculation module by receiving, by the receiving antenna, known total radiation power which is transmitted from a transmitting antenna of a known reference signal source being used instead of the device under test, to the known total radiation power transmitted from the transmitting antenna of the known reference signal source; and a calibration module which calibrates a total radiation power value which is calculated by the total radiation power calculation module by receiving, by the receiving antenna, total radiation power of a radio wave radiated from the device under test when the device under test is used, using the ratio of total radiation power which is calculated by the total radiation power calculation module by receiving, by the receiving antenna, the known total radiation power transmitted from the transmitting antenna of the known reference signal source, to the known total radiation power which is stored in the storage module.

* * * * *